(12) United States Patent
Goro et al.

(10) Patent No.: US 8,711,576 B2
(45) Date of Patent: Apr. 29, 2014

(54) ELECTRONIC APPARATUS AND MANUFACTURING METHOD OF ELECTRONIC APPARATUS

(75) Inventors: Tsukasa Goro, Kawasaki (JP); Koji Nakakubo, Kawasaki (JP); Satoshi Seino, Kawasaki (JP); Masaru Kanazawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 432 days.

(21) Appl. No.: 13/040,397

(22) Filed: Mar. 4, 2011

(65) Prior Publication Data

US 2011/0222260 A1    Sep. 15, 2011

(30) Foreign Application Priority Data

Mar. 12, 2010    (JP) .................................... 2010-55590

(51) Int. Cl.
*H05K 5/02*    (2006.01)
*H04B 1/03*    (2006.01)

(52) U.S. Cl.
USPC ...................... 361/814; 455/575.2; 455/575.3

(58) Field of Classification Search
USPC ......... 361/755, 814, 801–803, 728–730, 796, 361/800; 455/575.1–575.4
See application file for complete search history.

(56) References Cited

U.S. PATENT DOCUMENTS

| | | | |
|---|---|---|---|
| 5,933,330 A * | 8/1999 | Beutler et al. ................. | 361/814 |
| 6,708,046 B1 * | 3/2004 | Takagi ........................ | 455/575.3 |
| 7,596,358 B2 * | 9/2009 | Takagi ........................ | 455/90.3 |
| 8,238,843 B2 * | 8/2012 | Nakao et al. ................. | 455/90.3 |
| 8,483,783 B2 * | 7/2013 | Kanazawa et al. .......... | 455/575.3 |

FOREIGN PATENT DOCUMENTS

JP    2002-130250 A    5/2002

* cited by examiner

*Primary Examiner* — Hung S Bui
(74) *Attorney, Agent, or Firm* — Fujitsu Patent Center

(57) ABSTRACT

An electronic apparatus which includes a hinge module includes a first housing in which a window unit is formed in a holding unit which holds the hinge module, a second housing which is joined to the first housing, and a substrate holding member which is arranged between the first housing and the second housing, and wherein the substrate holding member passes through the window unit of the first housing and includes a locking unit which locks the hinge module by being pressed by the second housing.

11 Claims, 28 Drawing Sheets

US 8,711,576 B2

ELECTRONIC APPARATUS AND MANUFACTURING METHOD OF ELECTRONIC APPARATUS

CROSS-REFERENCE TO RELATED APPLICATIONS

This application is based upon and claims the benefit of priority from the prior Japanese Patent Application No. 2010-55590 filed on Mar. 12, 2010, the entire contents of which are incorporated herein by reference.

FIELD

The embodiments discussed herein are related to an electronic apparatus and to a manufacturing method of the electronic apparatus.

BACKGROUND

An electronic apparatus, such as a mobile terminal device, may have two coupled housings that are openable and closable by a hinge mechanism. The electronic apparatus includes a hinge module as a rotation axis that supports the two housings. The hinge module is used to rotatably couple the two housings to maintain a stable opening/closing function. To hold the hinge module on a housing side, the electronic apparatus includes an unhinging preventing part, and the like.

Japanese Laid-open Patent Publication No. 2002-130250 discloses an unhinging preventing structure. In the unhinging preventing structure disclosed in Japanese Laid-open Patent Publication No. 2002-130250, a shaft is press-fitted into the hinge module, and a claw-shaped hook whose end is enlarged is included. In the unhinging preventing structure disclosed in Japanese Laid-open Patent Publication No. 2002-130250, the hinge module passes through a second case body, and a claw shaped as a hook is hooked onto a first case body.

Regarding a foldable electronic apparatus with a hinge module, for example, the hinge module or the unhinging preventing part is removed when a substrate or the like inside the electronic apparatus is repaired or replaced. Since the unhinging preventing part is press-fitted into the housing of the electronic apparatus, for example, the assembling process and disassembling process of the electronic apparatus are troublesome. The unhinging preventing part is not reused after being removed. Another part is press-fitted into the housing of the electronic apparatus.

SUMMARY

According to an aspect of the invention, an electronic apparatus which includes a hinge module includes a first housing in which a window unit is formed in a holding unit which holds the hinge module, a second housing which is joined to the first housing, and a substrate holding member which is arranged between the first housing and the second housing, and wherein the substrate holding member passes through the window unit of the first housing and includes a locking unit which locks the hinge module by being pressed by the second housing.

The object and advantages of the invention will be realized and attained at least by the elements, features, and combinations particularly pointed out in the claims.

It is to be understood that both the foregoing general description and the following detailed description are exemplary and explanatory and are not restrictive of the invention, as claimed.

DESCRIPTION OF THE EMBODIMENTS

[First Embodiment]

According to a first embodiment, an electronic apparatus with a hinge module, the electronic apparatus includes a first housing, a second housing, and a substrate holding member that holds a plurality of substrates and includes a locking unit that locks the hinge module. According to the first embodiment, the first housing is joined to the second housing by having the substrate holding member between thereof, and the locking unit locks the hinge module by being pressed by the second housing. For example, the above-described electronic apparatus may be a mobile phone, whose components are openably/closably coupled by a hinge module, a notebook-size personal computer, or the like.

Figure 1:
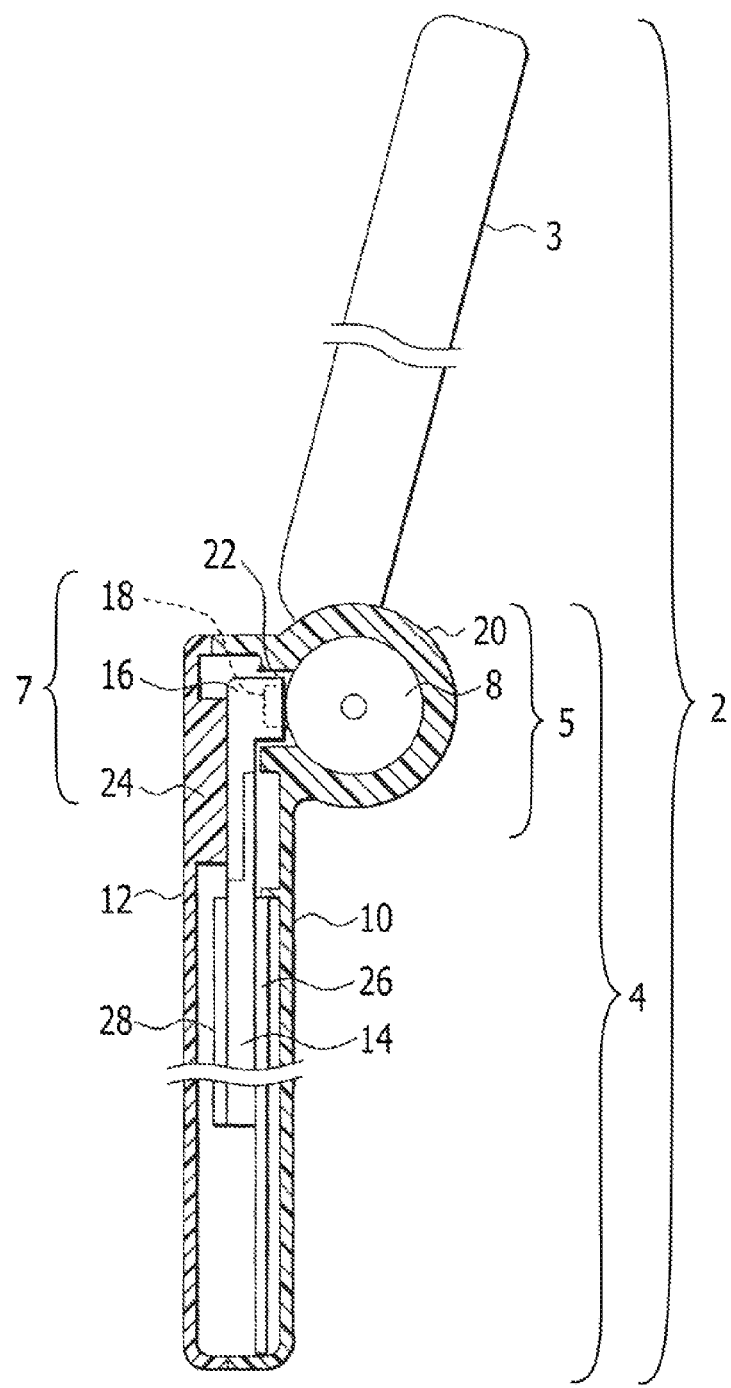
FIG. 1 is a diagram illustrating an example of an unhinging inhibiting mechanism unit of an electronic apparatus according to a first embodiment.
Figure 2:
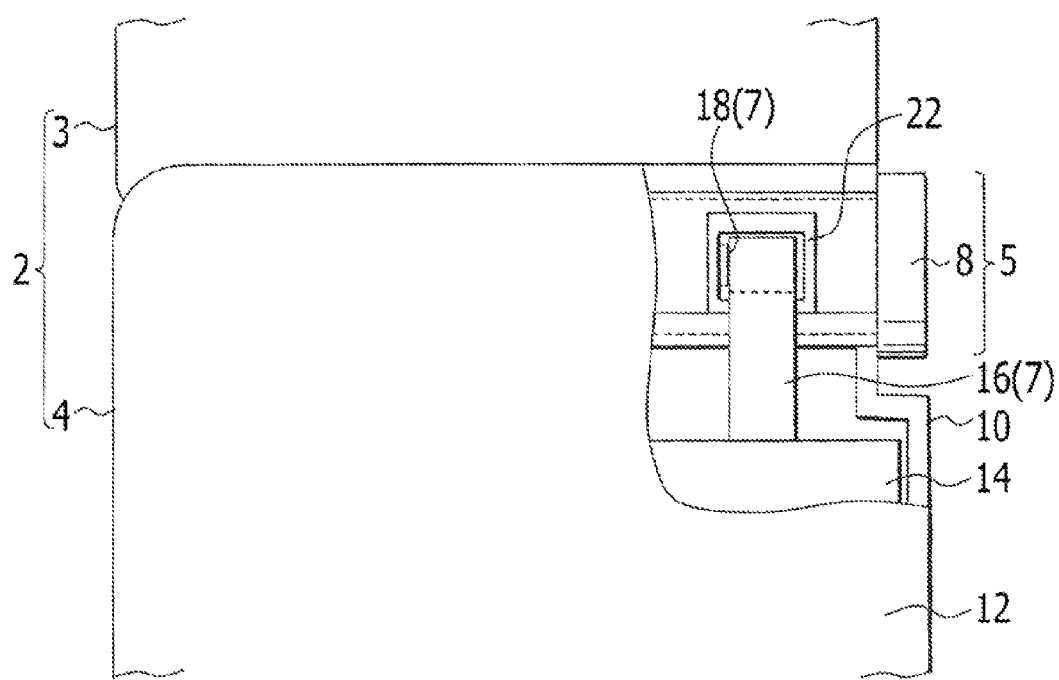
FIG. 2 is a diagram of the unhinging inhibiting mechanism unit viewed from a back side of the electronic apparatus.

With reference to FIGS. 1 and 2, a first embodiment will be described. FIG. 1 is a diagram illustrating an example of an unhinging inhibiting mechanism unit of the electronic apparatus according to the first embodiment. FIG. 2 is a diagram illustrating the unhinging inhibiting mechanism unit viewed from a back side of the electronic apparatus. The structure illustrated in FIG. 1 is an example, and the first embodiment is not limited to this example.

An electronic apparatus 2 is an example of the electronic apparatuses according to the first embodiment. As illustrated in FIG. 1, the electronic apparatus 2 includes a first case 3, a second case 4, a hinge unit 5, and an unhinging inhibiting mechanism unit 7.

The case 3 is a display side housing on which a display unit is installed. The case 4 is an operation side housing on which an operation unit such as a keyboard is installed. The hinge unit 5 is a mechanism unit that joins the case 3 to the case 4 and makes the case 3 and the case 4 openable and closable by using the hinge module 8. The unhinging inhibiting mechanism unit 7 inhibits the hinge module 8 arranged in the hinge unit 5 from becoming unhinged.

The case 4 includes a hinge module 8, a front side case unit 10, a back side case unit 12, and a substrate holding member 14.

The hinge module 8 is an example of an axis part used to openably/closably couple the case 3 to the case 4 included in the electronic apparatus 2. For example, the hinge module 8 is cylinder-shaped and is inserted from the side of the electronic apparatus 2. The hinge module 8 has a standing wall unit 18 included in the unhinging inhibiting mechanism unit 7.

The front side case unit 10 is an example of the first housing and includes a hinge holding unit 20 that holds the hinge module 8. The front side case unit 10 includes a window unit 22 that is opened toward the hinge module 8 inserted into the hinge holding unit 20.

The back side case unit 12 is an example of the second housing that is joined to the front side case unit 10. The back side case unit 12 includes a pressing unit 24 that is a part of the unhinging inhibiting mechanism unit 7 and is pressed toward the hinge module 8 by contacting the back side of the locking unit 16.

The substrate holding member 14 is an example of the substrate holding member that holds substrates 26 and 28 included in the electronic apparatus 2. For example, the substrate holding member 14 unitizes and arranges the substrates 26 and 28, which are held on the both sides of the substrate holding member 14, in a prescribed position in the electronic apparatus 2. The substrate holding member 14 includes a locking unit 16 that locks the hinge module 8 stored in the hinge holding unit 20.

The locking unit 16 is an example of the unhinging inhibiting mechanism unit 7 and inhibits the hinge module 8 from unhinging by locking on the hinge module 8. For example, an end side of the locking unit 16 is combined with the substrate holding member 14. The other end side of the locking unit 16 is a contact part of the hinge module 8 and is arranged on the side of the window unit 22 included in the front side case unit 10. By being pressed toward the hinge module 8 by the pressing unit 24 of the back side case unit 12, the other end side of the locking unit 16 contacts the side of the hinge module 8.

The standing wall unit 18 is an example of the unhinging inhibiting mechanism unit 7 included in the hinge module 8. If the standing wall unit 18 contacts the locking unit 16 that protrudes from the window unit 22 of the front side case unit 10, the hinge module 8 is inhibited from moving to the insertion hole of the hinge module 8.

As illustrated in FIG. 2, the window unit 22 is opened toward the hinge holding unit 20 in a part of the front side case unit 10. For example, the open position may be adjusted to be an arrangement position of the standing wall unit 18 of the inserted hinge module 8.

For example, the electronic apparatus 2 is assembled by installing the substrate holding member 14 in a position where the locking unit 16 passes through the window unit 22 and installing the back side case unit 12 after the hinge module 8 is inserted in a direction in which the standing wall unit 18 is positioned in the window unit 22.

The back side case unit 12 is fixed to the front side case 10 by a fastening unit such as a screw, for example. Therefore, the substrate holding member 14 is fixed between the front side case unit 10 and the back side case unit 12, and the locking unit 16 is pressed, from the window unit 22, toward the hinge module 8 by the pressing unit 24 of the back side case unit 12. If the assembly of the front side case 10 and the back side case 12 is released, the substrate holding member 14 may be removed, and the locking of the locking unit 16 and the hinge module 8 may be released.

A reinforced member may be provided between the locking unit 16 and the hinge module 8 to inhibit the locking unit 16 from being damaged or the like due to press by the pressing unit 24. The reinforced member may be made of metallic materials and may be used as an antenna of the hinge module 8 by being electrically coupled to the substrate.

If the locking unit 16 included in the substrate holding member 14 is locked on the hinge module 8 from the window unit 22 of the front side case unit 10, the hinge module 8 may be inhibited from unhinging. If the substrate holding member 14 is fixed by joining the front side case unit 10 to the back side case unit 12 and if the locking unit 16 is pressed toward the hinge module 8, the substrate holding member 14 may be locked more tightly. If the assembly of the front side case unit 10 and the back side case unit 12 is released, the locking of the locking unit 16 on the hinge module 8 is released. Thus, the assembling property is improved, and the locking unit 16 may be reused in reassembling. The first embodiment improves both the holding strength of the hinge module 8 and assembling property of the electronic apparatus 2. The hinge module 8 may be held by joining the front side case unit 10 to the back side case unit 12. Therefore, the assembling process may be reduced, and the assembling and reassembiling may become easier and quicker. Furthermore, maintenance such as fixing and adjusting may become easier and quicker.

[Second Embodiment]

A second embodiment is related to a configuration example of a mobile phone as an example of the electronic apparatus having an unhinging inhibiting mechanism unit.

Figure 3:
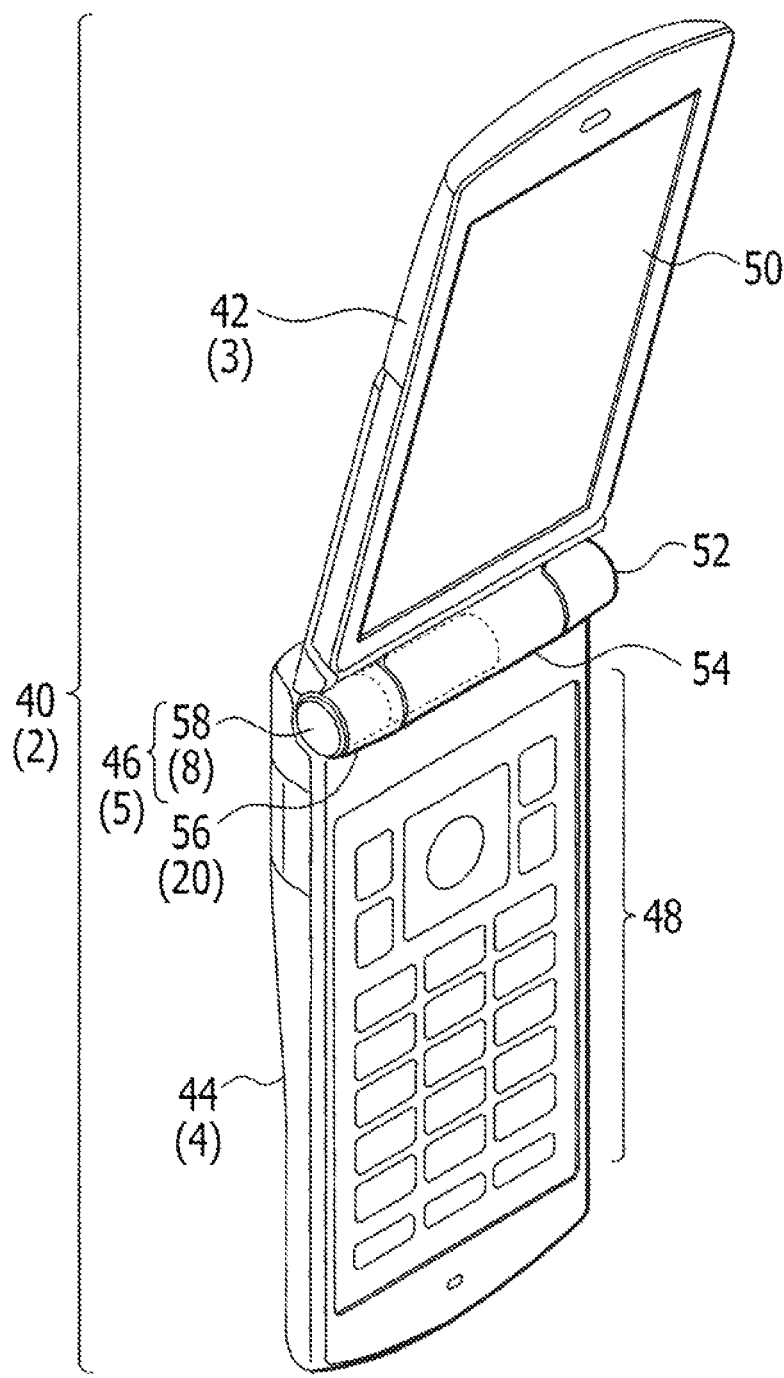
FIG. 3 is a diagram of a mobile phone, which is viewed from the front side, according to a second embodiment.
Figure 4:
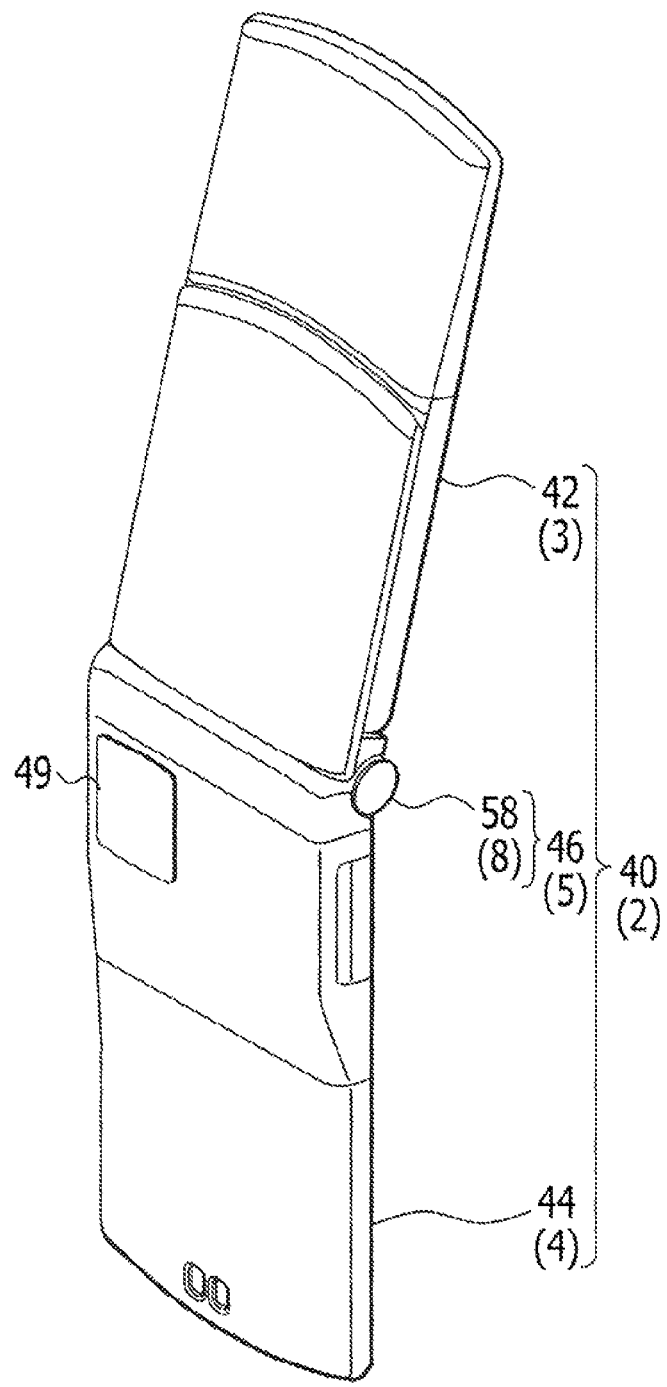
FIG. 4 is a diagram of the mobile phone viewed from the back side.
Figure 5:
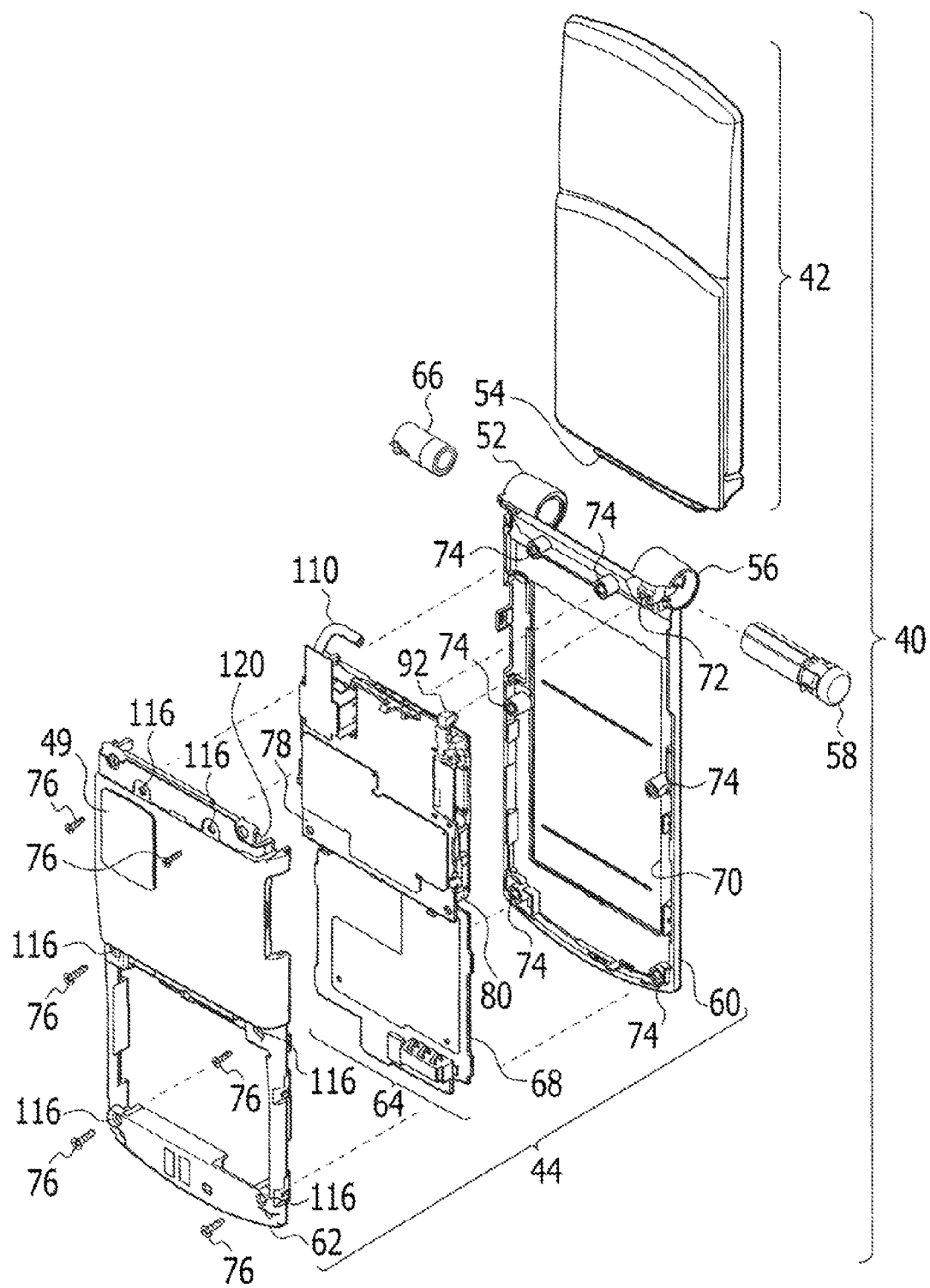
FIG. 5 is a cross-section diagram of a keyboard side housing.
Figure 6:
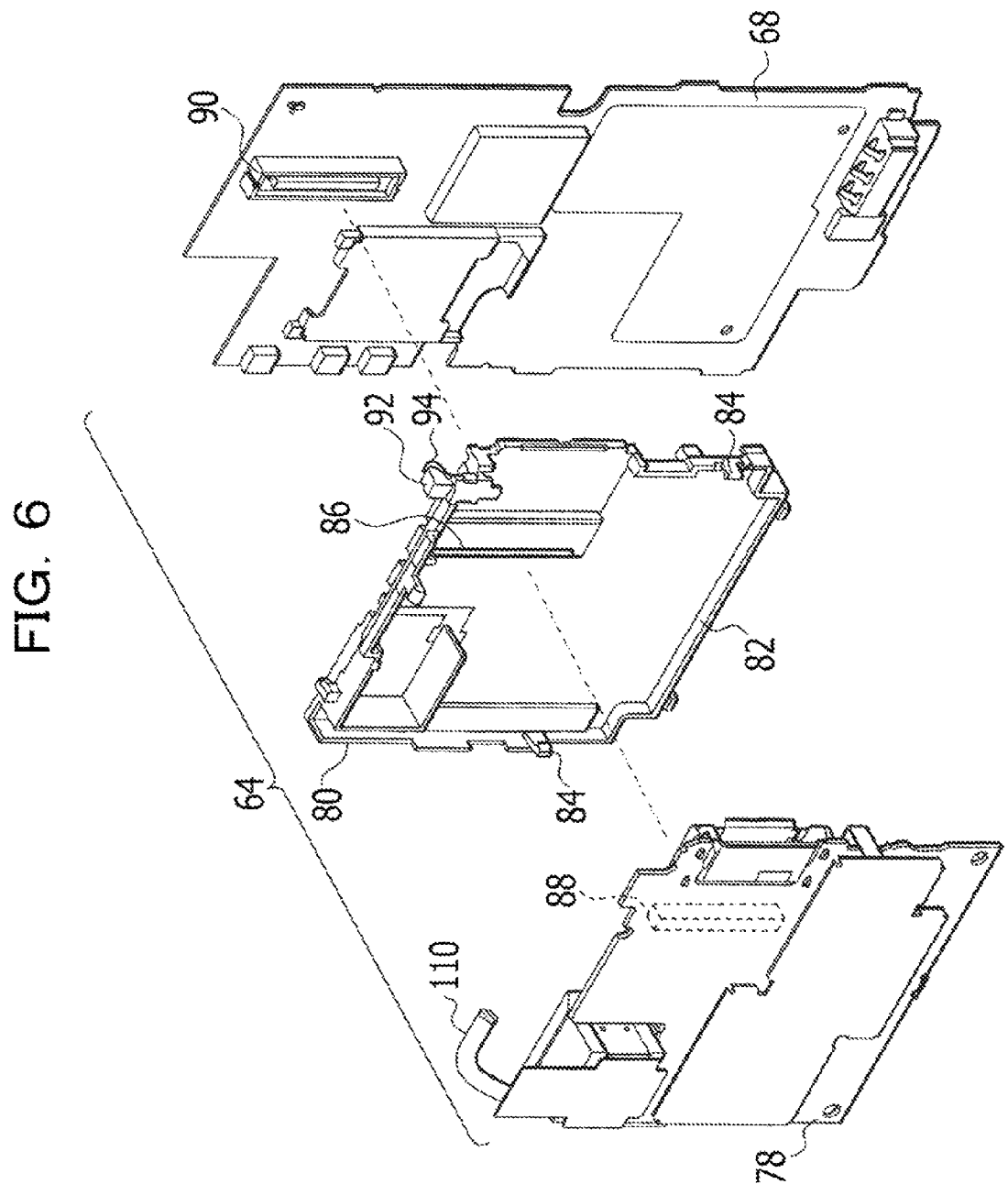
FIG. 6 is a cross-section diagram of a substrate assembly.
Figure 7:
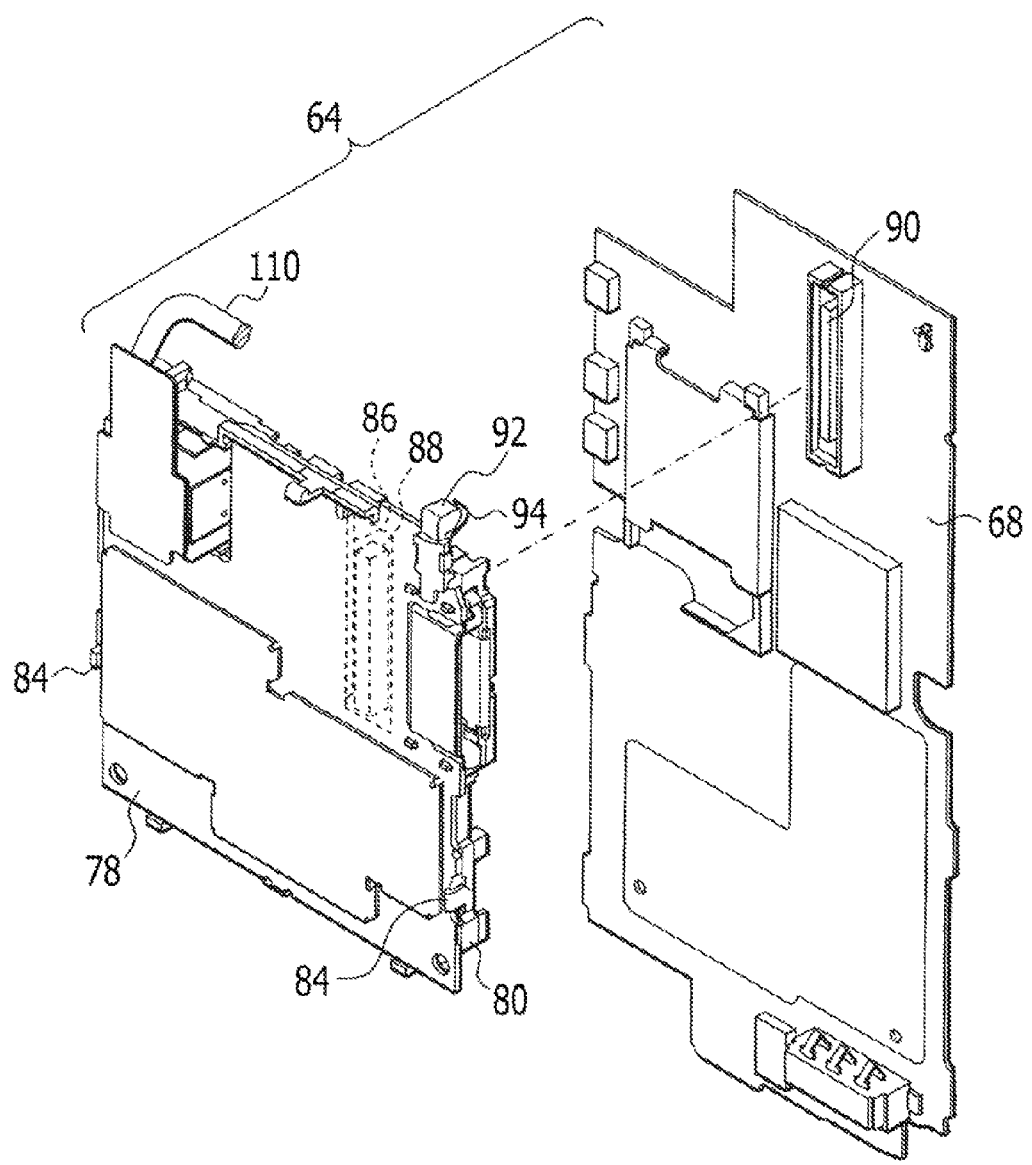
FIG. 7 is a diagram illustrating a coupled-state of the substrate holding member that holds the substrate of the back side and the substrate of the front side.
Figure 8:
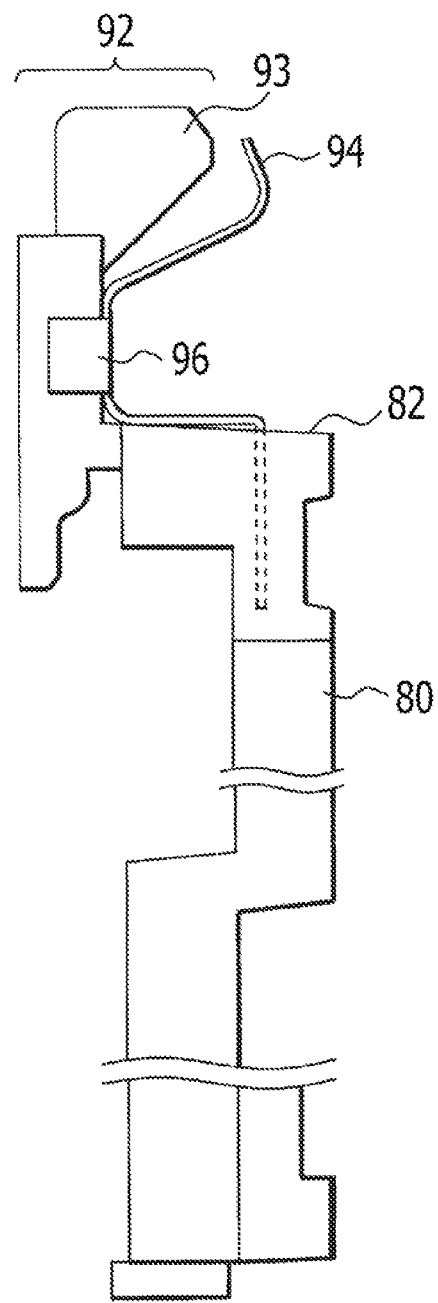
FIG. 8 is a side view of a substrate holding member.
Figure 9:
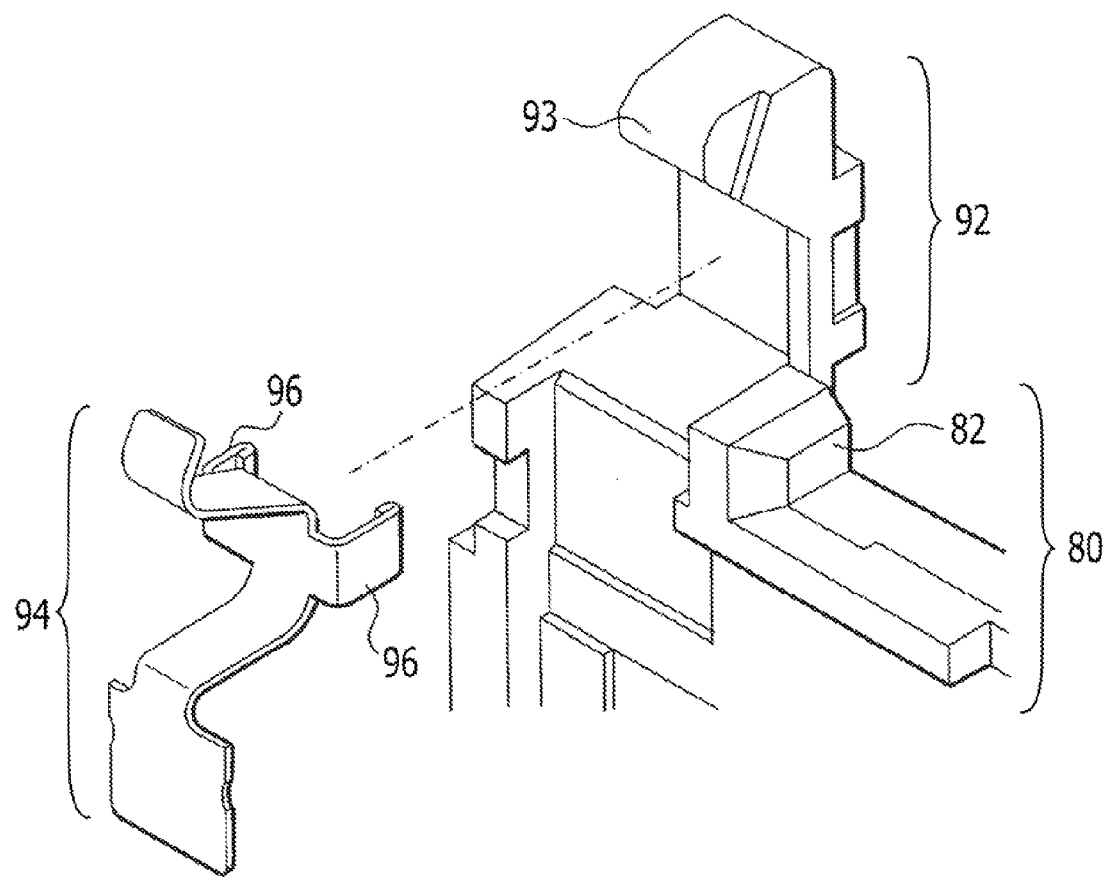
FIG. 9 is a diagram illustrating the coupled-state of a locking pin and a reinforced member.
Figure 10:
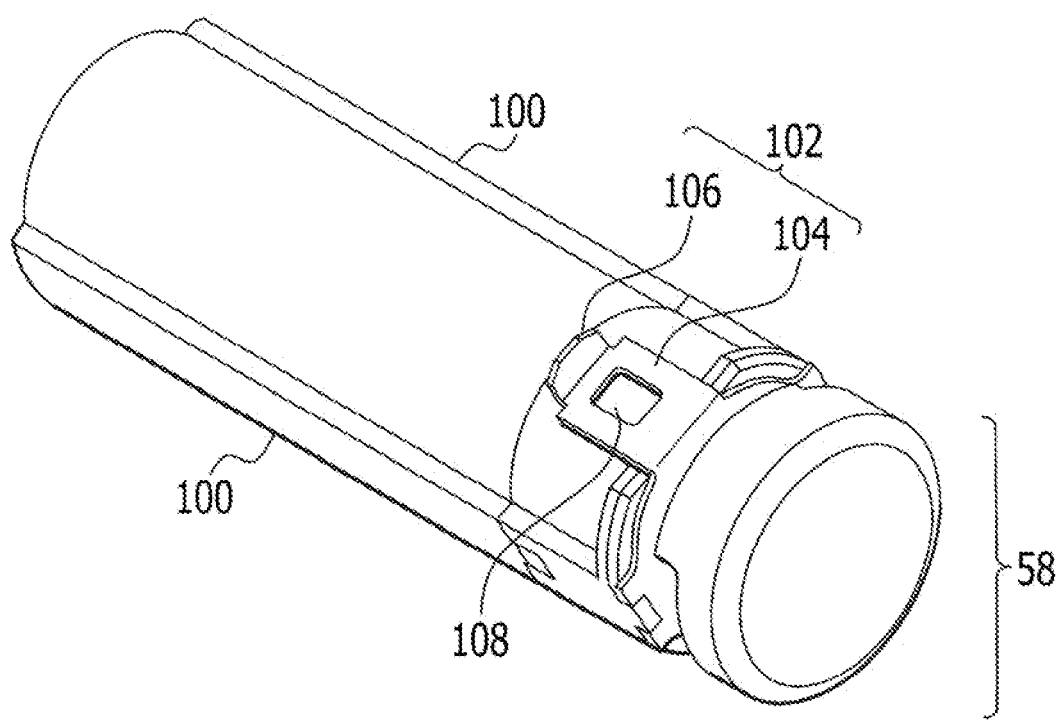
FIG. 10 is a diagram illustrating an appearance structure example of a hinge module.
Figure 11:
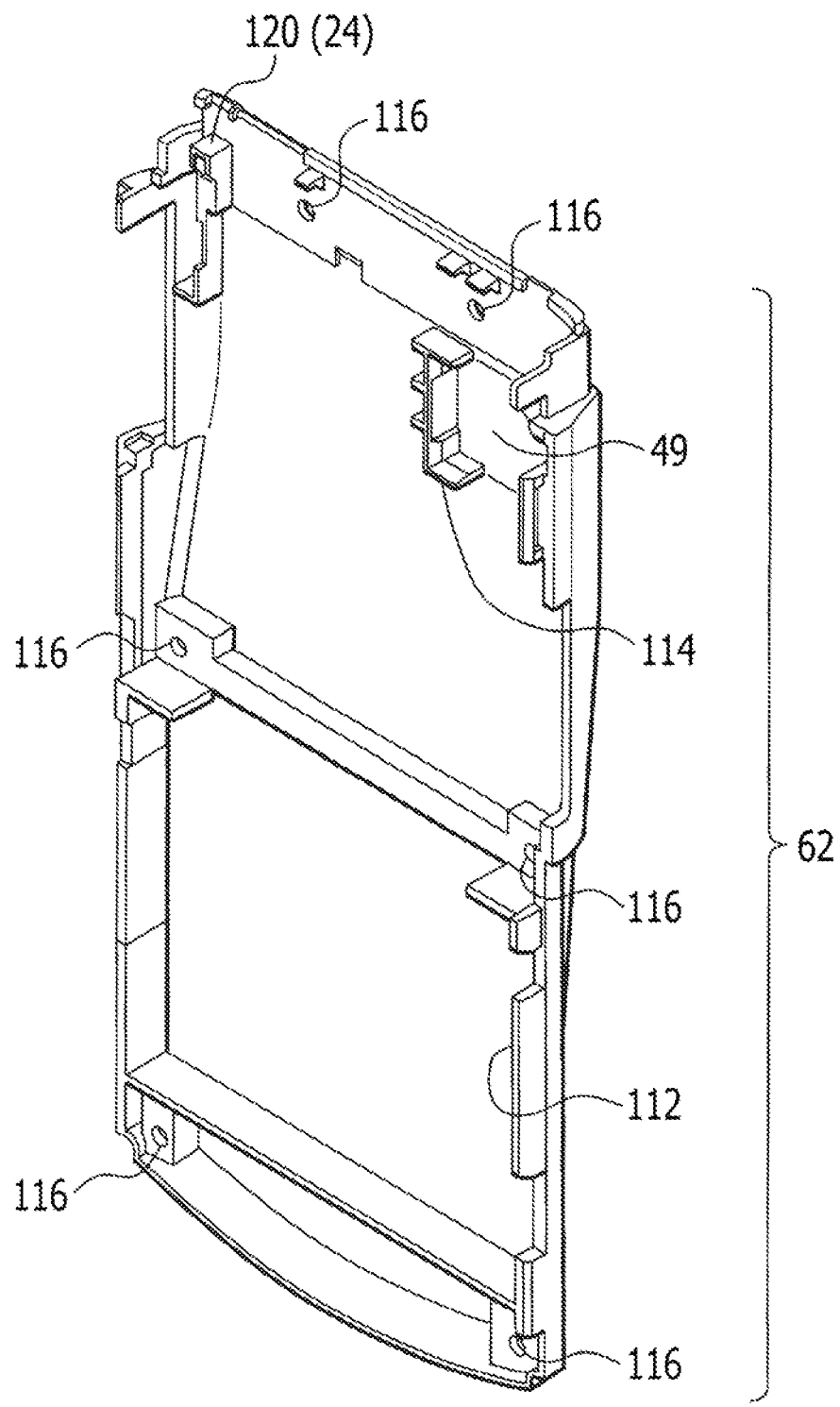
FIG. 11 is a diagram illustrating an appearance structure example of a rear case.

The second embodiment will be described with reference to FIGS. 3, 4, 5, 6, 7, 8, 9, 10, and 11. FIG. 3 is a diagram of a mobile phone, which is viewed from the front side, according to the second embodiment. FIG. 4 is a diagram of the mobile phone viewed from the back side. FIG. 5 is a cross-section diagram of a keyboard side housing. FIG. 6 is a cross-section diagram of a substrate assembly. FIG. 7 is a diagram illustrating a coupled-state of the substrate holding member that holds the substrate of the back side and the substrate of the front side. FIG. 8 is a side view of a substrate holding member. FIG. 9 is a diagram illustrating the coupled-state of a locking pin and a reinforced member. FIG. 10 is a diagram illustrating an appearance structure example of a hinge module. FIG. 11 is a diagram illustrating an appearance structure example of a rear case. The configurations illustrated in FIGS. 3, 4, 5, 6, 7, 8, 9, 10 and 11 are examples. The configurations of FIGS. 3, 4, 5, 6, 7, 8, 9, 10, and 11 may be substantially equivalent to FIGS. 1 and 2, therefore, the descriptions are omitted.

A mobile phone 40, which is an example of the electronic apparatus, includes an unhinging inhibiting mechanism unit. For the mobile phone 40, a display side housing 42 is openably/closably coupled to a keyboard side housing 44 by a hinge unit 46. As illustrated in FIG. 3, the keyboard side housing 44 includes a keyboard unit 48 or the like as an input unit of characters. As illustrated in FIG. 4, the back side of the keyboard side housing 44 includes, for example, a camera window unit 49 in which a camera module or the like is arranged and a battery module or the like inside the keyboard side housing 44. A display unit 50 that includes a Liquid Crystal Display (LCD) or the like is installed on the display side housing 42.

The hinge unit 46 is an example of an open/close mechanism unit. For the hinge unit 46, as illustrated in FIG. 3, hinge holding units 52, 54, and 56 included in the display side housing 42 and the keyboard side housing 44 are arranged in this order, and a hinge module 58 passes through therein. The display side housing 42 is openably/closably coupled to the keyboard side housing 44 by the inserted hinge module 58 as an axis unit. The hinge module 58 is inserted from the side of the keyboard side housing 44, and an unhinging inhibiting mechanism unit is included inside the keyboard side housing 44.

As illustrated in FIG. 5, for example, the keyboard side housing 44 includes a fixed front case 60, a fixed rear case 62, a substrate assembly 64, the hinge module 58, a dummy hinge 66, and the like.

The fixed front case 60 is an example of the first housing and holds the substrate assembly 64 by being joined to the fixed rear case 62. The fixed front case 60 includes an operation window unit 70 in which a keypad or the like is arranged with respect to the input unit installed on the substrate 68, and the hinge holding units 52 and 56 that hold the hinge module 58 and the dummy hinge 66. On the fixed front case 62, a window unit 72 is formed to be opened toward the hinge holding unit 56 into which the hinge module 58 is inserted. A plurality of fixed holes 74 is formed on an inner edge of the fixed front case 60. Inside each of the fixed holes 74, for example, an internal screw is provided to be used to fasten a fixing screw 76 as a fastening unit.

The substrate assembly 64 is an example of substrate assembly holding a plurality of substrates 68 and 78. The substrate assembly 64 includes the substrate 68 in which a dome switch or the like as an electronic contact point of an operation key such as a 10 key is mounted, the substrate 78 with a camera module or the like, and a substrate holding member by which the substrates 68 and 78 are attached. The substrate holding member is indicated as a numeral 80 in FIG. 6. The substrate assembly 64 is fixed between the fixed front case 60 and the fixed rear case 62. As illustrated in FIG. 6, for example, a substrate holding member 80 is arranged between the substrates 68 and 78 with respect to the front side and the back side of the mobile phone 40.

The substrate holding member 80, which is an example of a unit that holds the substrates 68 and 78 in one body, unitizes the substrates 68 and 78, and other parts. On the back side of the substrate holding member 80, a surrounding wall unit 82 with a certain height on the edge and a locking claw 84 are formed. The substrate 78 is arranged on the surrounding wall unit 82 and locked in a prescribed position by the locking claw 84. Inside the substrate holding member 80, a substrate window unit 86 is provided to couple the substrate 68 to the substrate 78 held on the both sides of the substrate holding member 80. As illustrated in FIG. 7, the substrate holding member 80 couples, through the substrate window unit 86, a terminal unit 88, which is included in the substrate 78 held on the back side of the substrate holding member 80, to a terminal unit 90 of the substrate 68 held on the front side of the substrate holding member 80. The substrate holding member 80 may hold the substrates 68 and 78 in the prescribed position.

For example, a part of the upper side of the substrate holding member 80 has a locking pin 92 that locks the hinge module 58. The locking pin 92, which is an example of the locking unit, is included in the unhinging inhibiting mechanism unit of the hinge module 58 inserted into the hinge holding unit 56. As illustrated in FIG. 8, for example, the locking pin 92 is provided on the surrounding wall unit 82 of the substrate holding member 80 and has a contact unit 93 that contacts the hinge module 58.

The substrate holding member 80 includes a spring 94 as a reinforced member to reinforce the locking pin 92. As illustrated in FIGS. 8 and 9, the spring 94 is a metallic plate spring, and a part of the spring 94 is installed along the side of the locking pin 92. The spring 94 is bent to be arranged toward the contact unit 93 at the end of the locking pin 92 so that a space is formed. The spring 94 includes a gripping unit 96 that grips a part of the locking pin 92. The unhinging inhibiting mechanism using the locking pin 92 may inhibit the locking pin 92 from being damaged by a force against an unhinging direction of the hinge module 58, a pressing force from a pressing unit 120, or the like against the locking pin 92. The pressing unit 120 is disclosed in FIG. 11.

The spring 94 functions as a reinforced member for the locking pin 92. Furthermore, the spring 94 makes the terminal unit 88 contact the terminal unit 90 included in the substrate 78 and the substrate 68, respectively, so that the terminal unit 88 is electrically coupled to the terminal unit 90.

As illustrated in FIG. 10, the hinge module 58, which is used to openably/closably couple the keyboard side housing 44 to the display side housing 42, is cylinder-shaped, for example. In this cylinder-shaped form, a guide key 100 is formed to fit into a key groove 130 provided inside the hinge holding unit 56. The key groove 130 is disclosed in FIG. 16. For example, the guide key 100 inhibits the hinge module 58 from rotating inside the hinge holding unit 56. Furthermore, the guide key 100 is an example of a unit that limits the insertion direction at a prescribed value of the hinge module 58 with respect to an unhinging inhibiting mechanism unit that will be described below. A part of the side of the cylinder-shaped form of the hinge module 58 includes a locking member 102 that locks the locking pin 92 and the spring 94. For example, the locking member 102 is formed by metal materials and includes a flat surface unit 104 and a standing wall unit 106 on the side of the cylinder-shaped form. The flat surface unit 104 of the locking member 102 includes a hole 108 that locks the locking pin 92 and the spring 94. The standing wall unit 106 inhibits the hinge module 58 from unhinging by locking the hinge module 58 on the locking pin 92 or the spring 94.

As illustrated in FIG. 5, the dummy hinge 66 is an example of a unit that openably/closably couples the keyboard side housing 44 to the display side housing 42 by being passed through the hinge holding units 52 and 54. The dummy hinge 66 has a hole through which a cable 110 or the like passes. The cable 110 coupled to the substrate 78 by the dummy hinge 66 may be led to a substrate installed inside the display side housing 42.

The fixed rear case 62, which is an example of the second housing, holds the substrate assembly 64 by being joined to the fixed front case 60. As illustrated in FIG. 11, the lower part of the fixed rear case 62 includes a storage unit 112 that stores a battery or the like of the mobile phone 40 by being joined to an exterior case (not illustrated). The upper part of the fixed rear case 62 includes, for example, a standing wall unit 114 that holds a camera module or the like, which is installed on the substrate 78, in the camera window unit 49. On the inside edge of the fixed rear case 62, a plurality of fixed holes 116 used to fasten the joined fixed front case 60 and fixed rear case 62 by using the fixing screw 76 as a fastening unit is formed.

A part on the upper part of the fixed rear case 62 includes the pressing unit 120 that presses the locking pin 92 from the back side by being joined to the fixed front case 60. The pressing unit 120 is an example of an unhinging inhibiting mechanism unit of the hinge module 58 that presses the locking pin 92 toward the hinge module 58.

Figure 12:
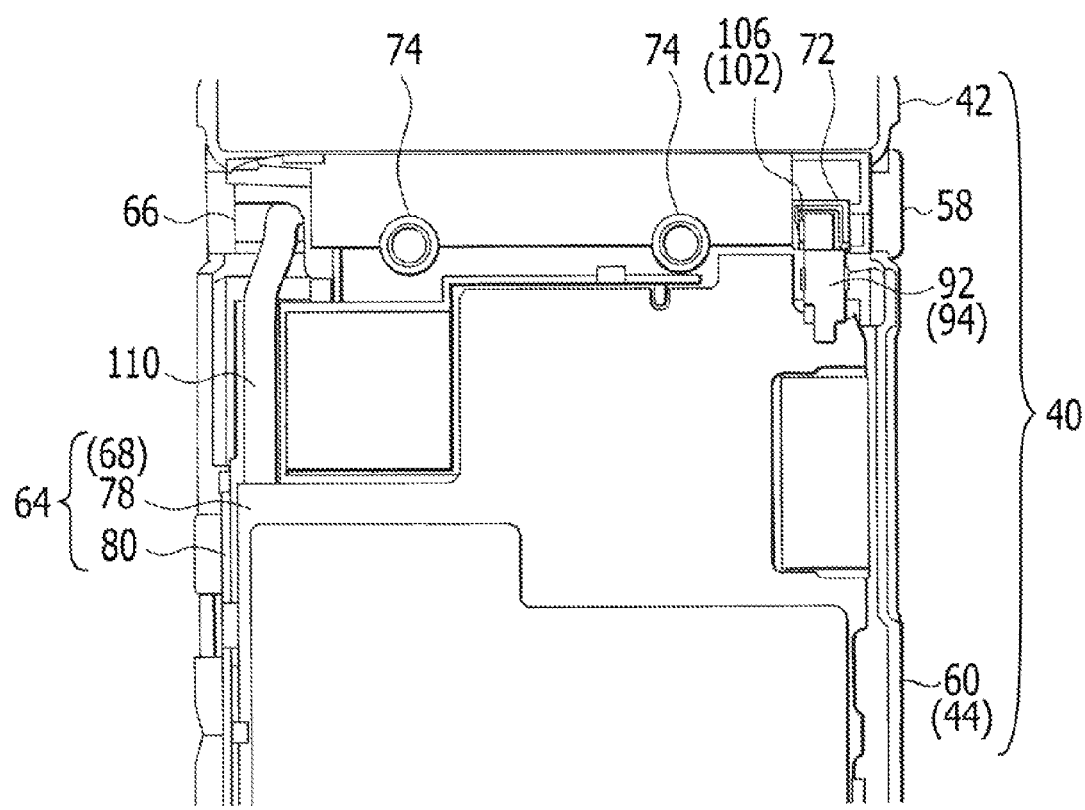
FIG. 12 is a diagram illustrating a state in which a substrate assembly is installed in a fixed front case.
Figure 13:
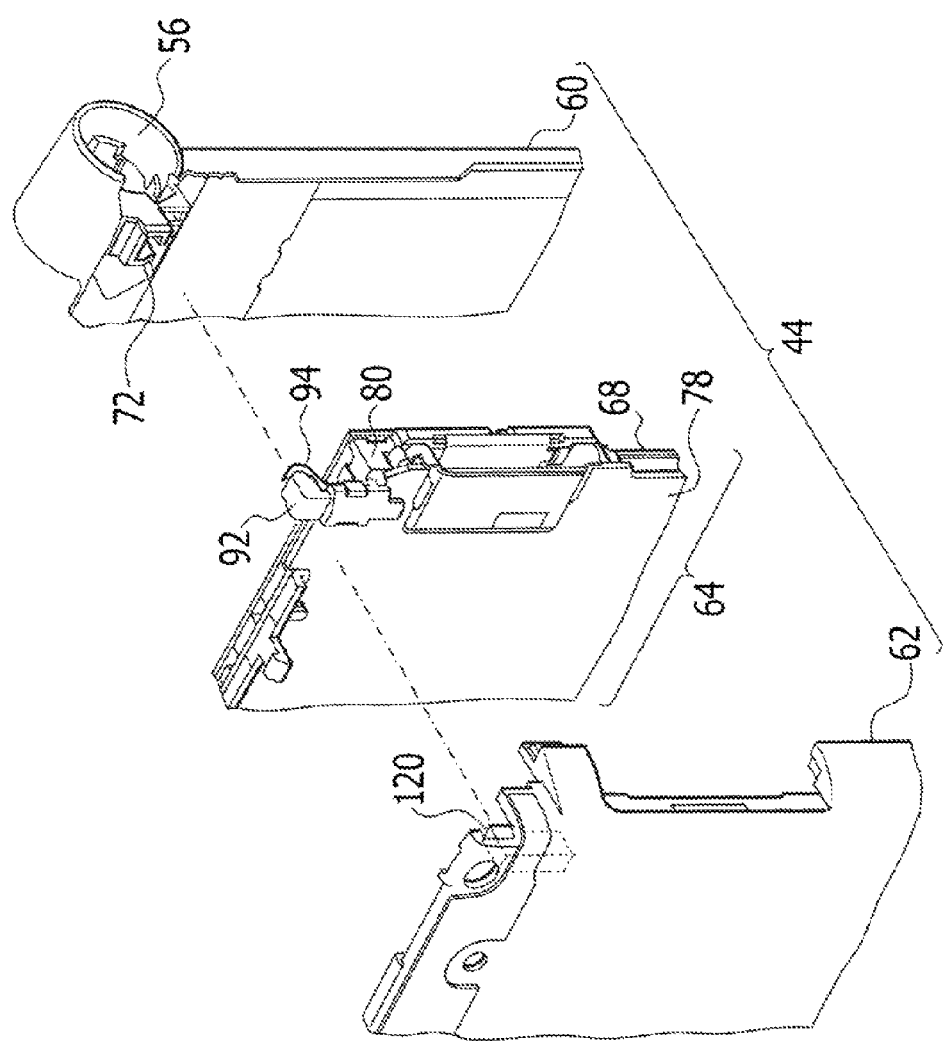
FIG. 13 is a diagram illustrating coupling of a hinge holding unit, a locking pin, and a fixed rear case viewed from the back side.
Figure 14:
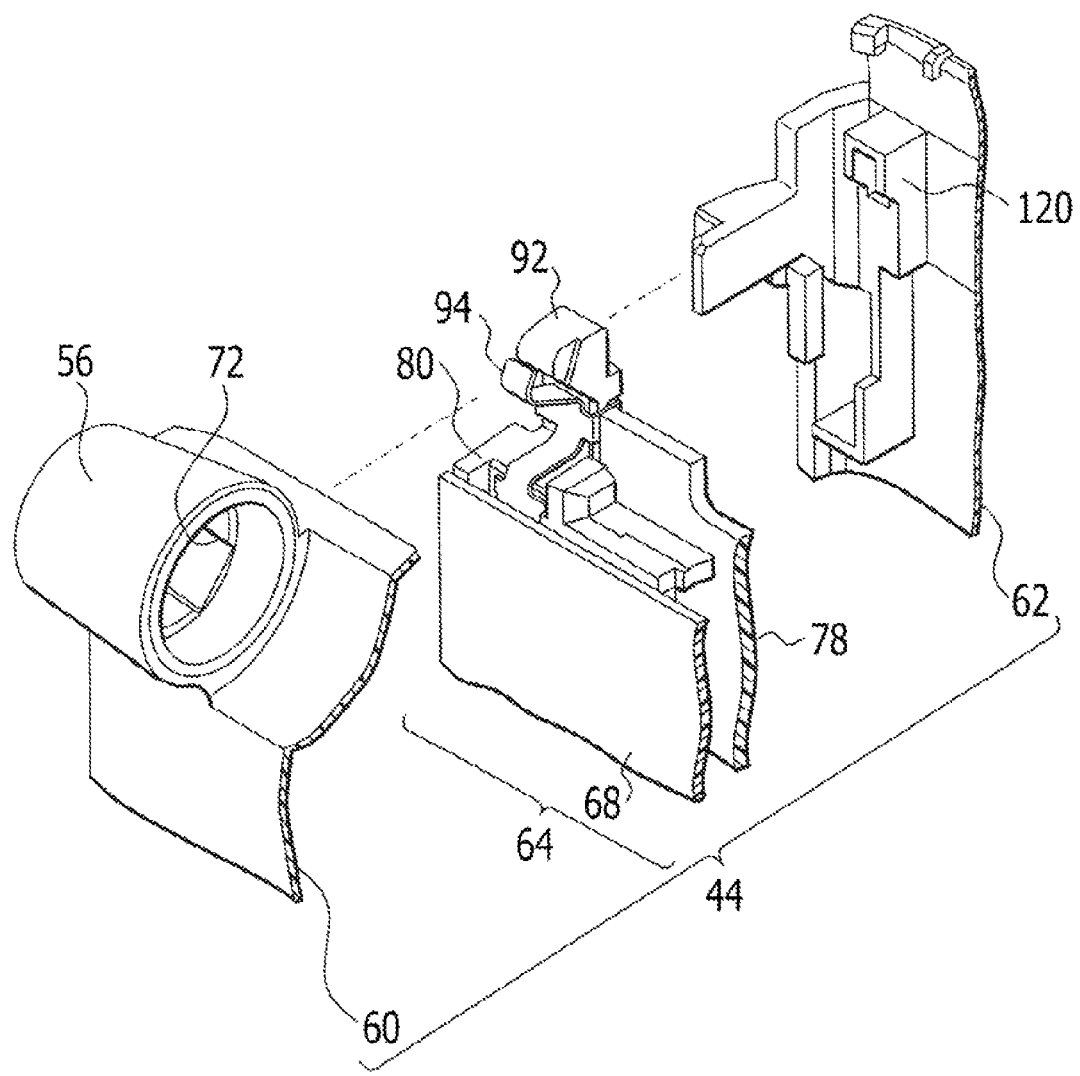
FIG. 14 is a diagram illustrating coupling of the hinge holding unit, the locking pin, and the fixed rear case viewed from the front side.

With reference to FIGS. 12, 13, and 14, a joining-state of the unhinging inhibiting mechanism unit will be described. FIG. 12 is a diagram illustrating a state in which a substrate assembly is installed in a fixed front case. FIG. 13 is a diagram illustrating coupling of a hinge holding unit, a locking pin, and a fixed rear case viewed from the back side. FIG. 14 is a diagram illustrating coupling of the hinge holding unit, the locking pin, and the fixed rear case viewed from the front side. The configurations illustrated in FIGS. 12, 13, and 14 are examples. In FIGS. 12, 13, and 14, the configurations may be substantially equivalent to FIGS. 5, 6, and 7 are indicated with the same numerals, and the same descriptions are omitted.

The substrate assembly 64 is mounted on a prescribed installing point of the fixed front case 60. The installing point may be provided in a position where the locking pin 92 included in the substrate holding member 80 may passes through the window unit 72. In the window unit 72, the flat surface unit 104 and the hole 108 included in the locking member 102 of the hinge module 58 inserted into the hinge holding unit 56 are arranged. The locking pin 92 is locked on the flat surface unit 104 and the hole 108 through the window unit 72. The dummy hinge 66 inserted into the hinge holding unit 52 allows the cable 110 or the like arranged from the substrate assembly 64 to pass through the hole thereof.

As illustrated in FIGS. 13 and 14, the pressing unit 120 of the fixed rear case 62 is arranged to contact the back side of the locking pin 92, which is arranged corresponding to the window unit 72, if the fixed front case 60 is joined to the fixed rear case 62. The locking pin 92 contacts the hinge module 58 inside the hinge holding unit 56 by contacting the pressing unit 120 and being pressed toward the window unit 72. The spring 94 as a reinforced member passes through the window unit 72 with the locking pin 92 and contacts the hinge module 58.

Figure 15:
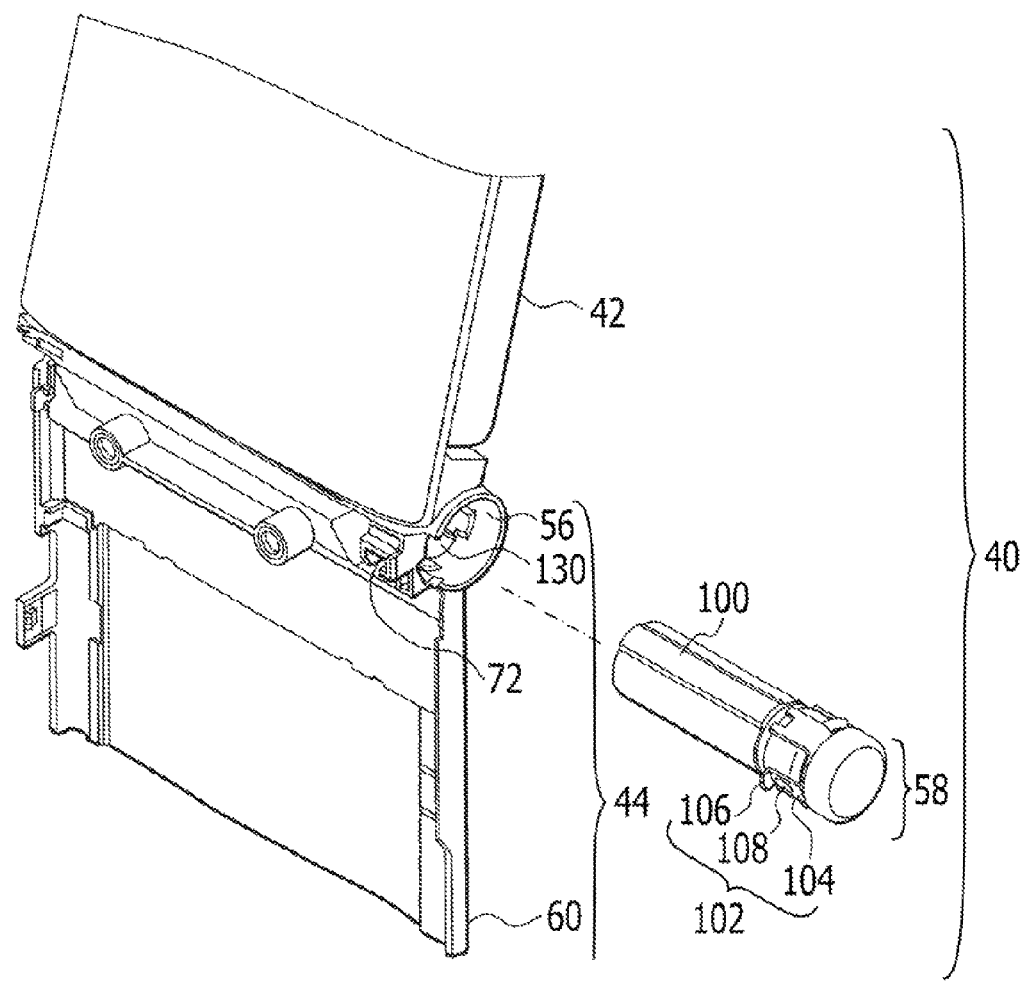
FIG. 15 is a diagram illustrating a state before a hinge module is inserted into a hinge holding unit.
Figure 16:
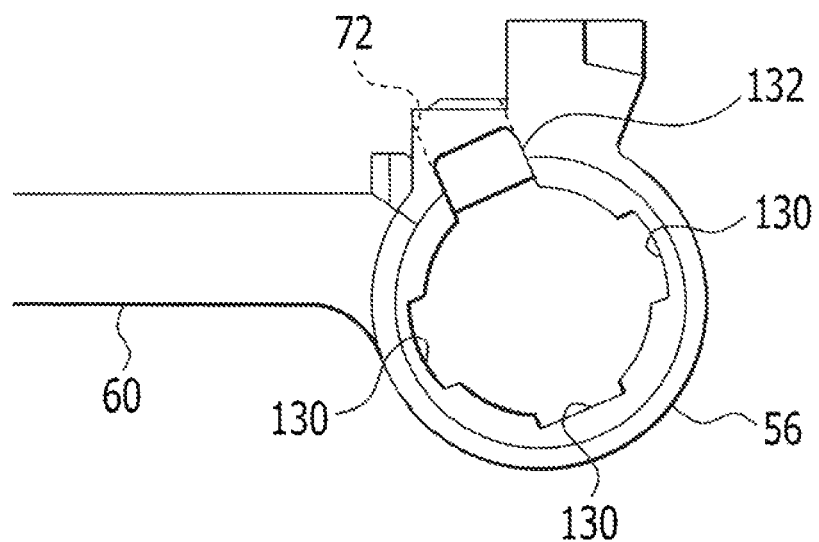
FIG. 16 is a diagram illustrating a side of a hinge holding unit.
Figure 17:
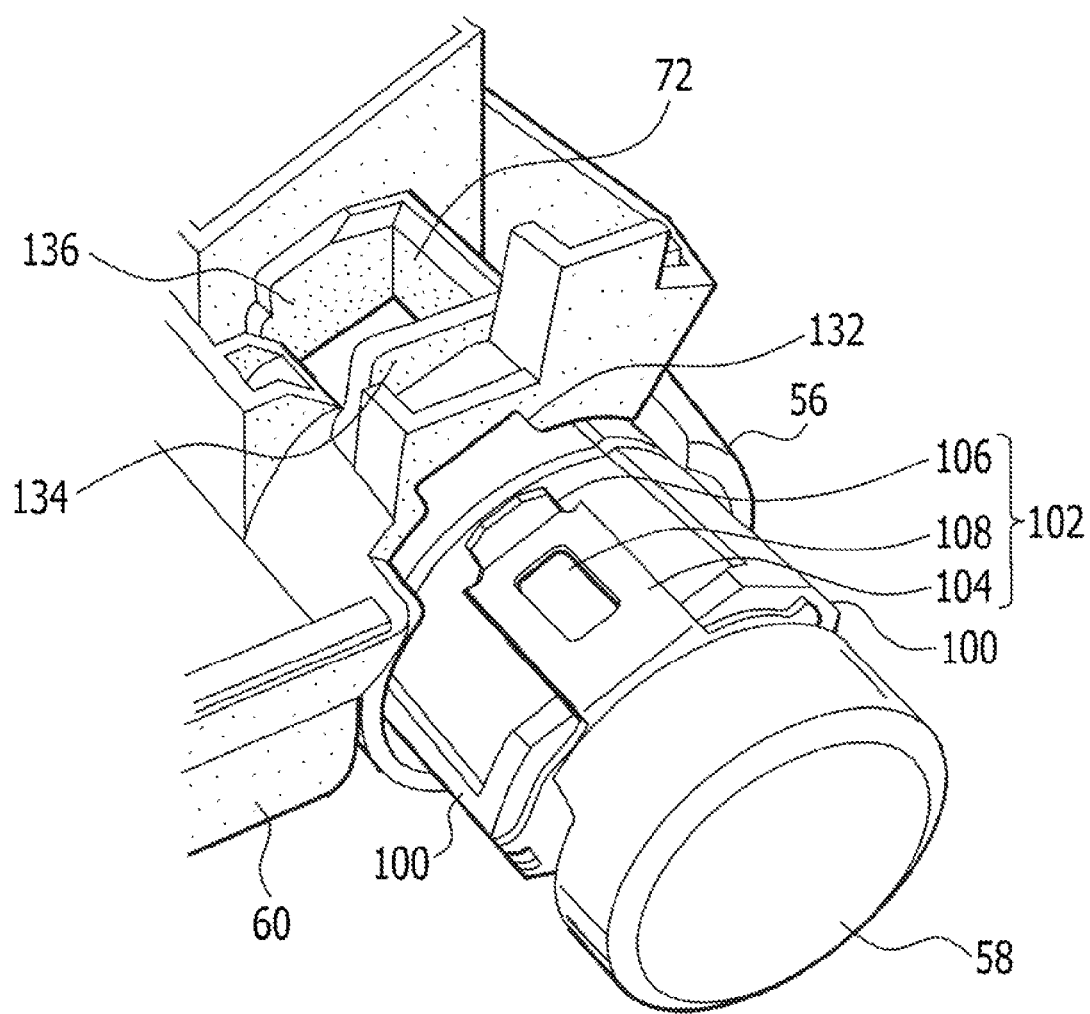
FIG. 17 is a diagram illustrating a state of the middle of insertion of the hinge module.
Figure 18:
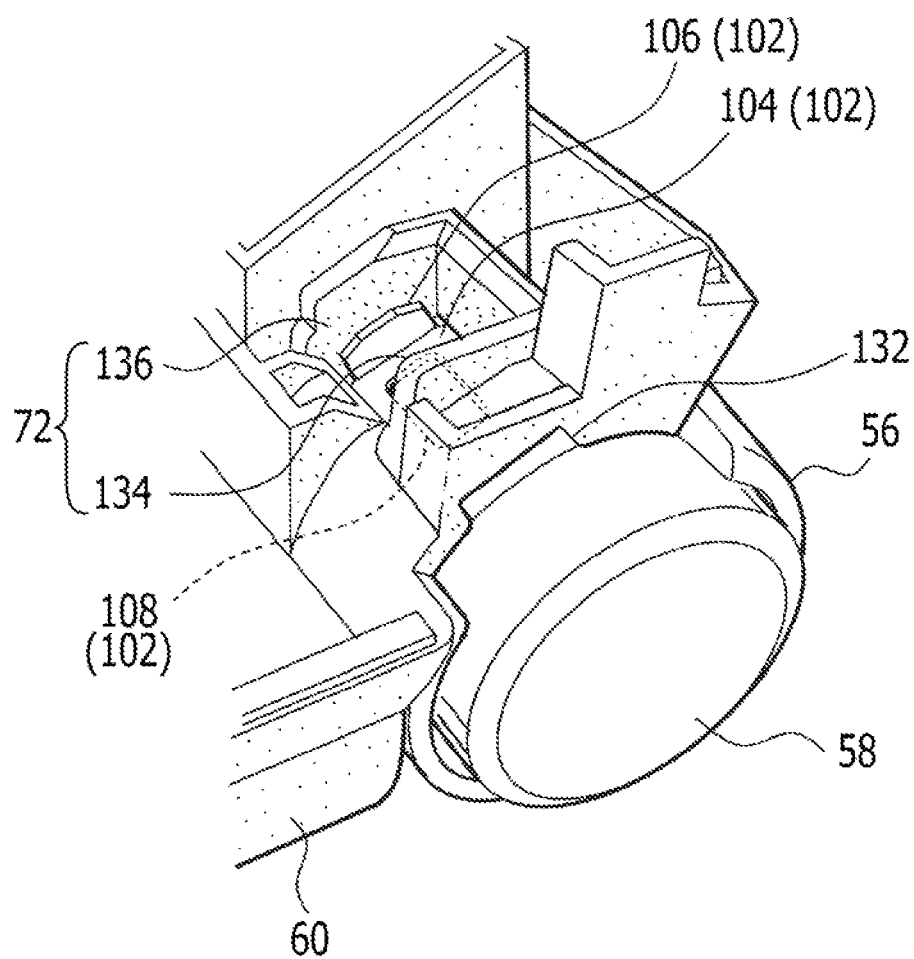
FIG. 18 is a diagram illustrating a state in which a hinge module is inserted into a hinge holding unit.
Figure 19:
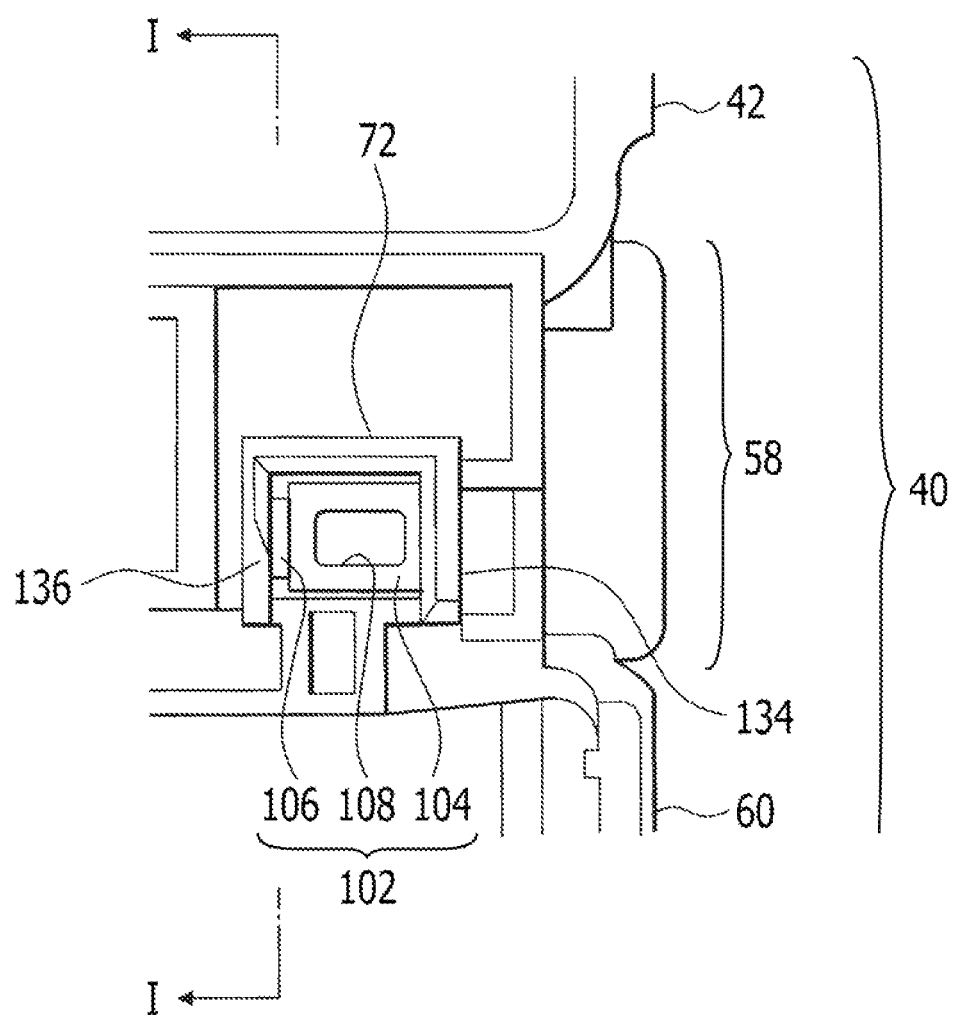
FIG. 19 is a diagram illustrating the hinge module inside the hinge holding unit viewed from the window unit.
Figure 20:
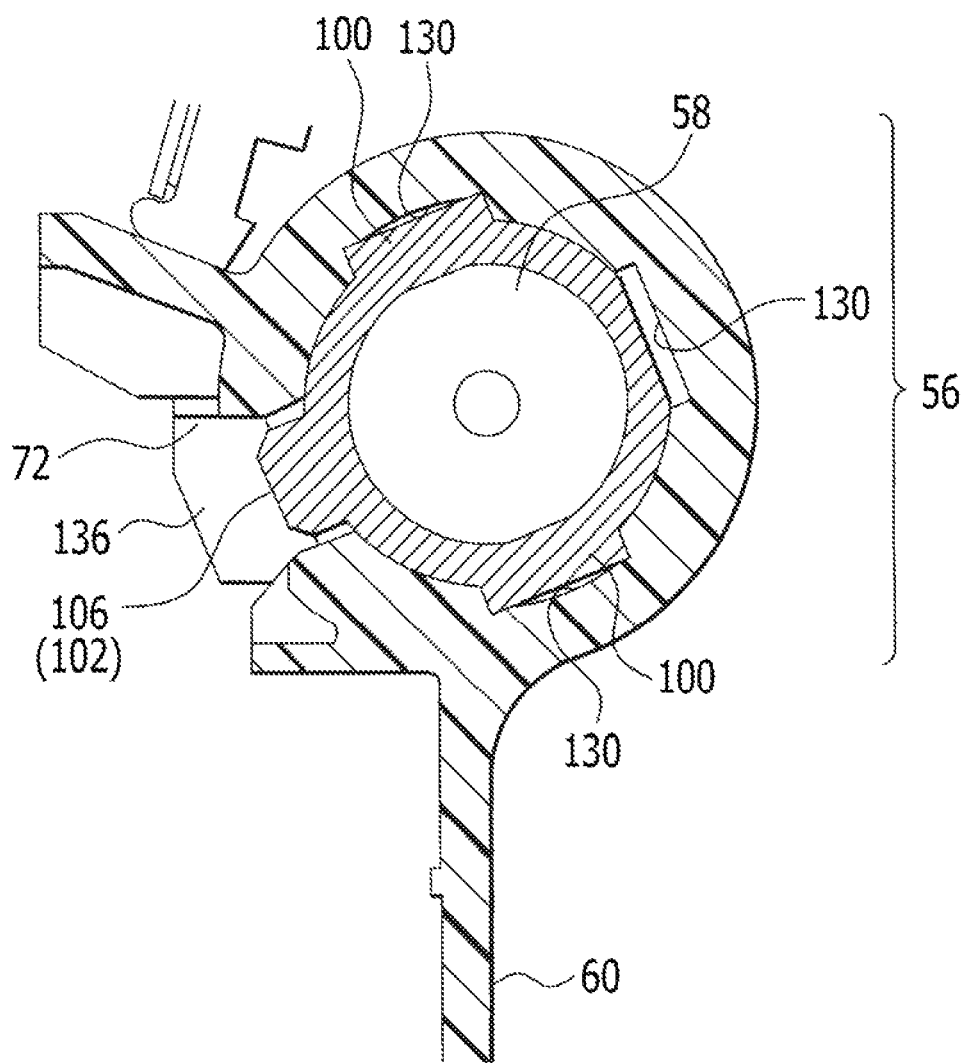
FIG. 20 is an I-I cross-section diagram of FIG. 19.

With reference to FIGS. 15, 16, 17, 18, 19, and 20, insertion of the hinge module into the hinge holding unit is described. FIG. 15 is a diagram illustrating a state before a hinge module is inserted into a hinge holding unit. FIG. 16 is a diagram illustrating a side of a hinge holding unit. FIG. 17 is a diagram illustrating a state of the middle of insertion of the hinge module. FIG. 18 is a diagram illustrating a state in which a hinge module is inserted into a hinge holding unit. FIG. 19 is a diagram illustrating the hinge module inside the hinge holding unit viewed from the window unit. FIG. 20 is an I-I cross-section diagram of FIG. 19. The configurations illustrated in FIGS. 15, 16, 17, 18, 19, and 20 are examples.

For example, the hinge module 58 is inserted into the hinge holding unit 56 from the side of the mobile phone 40. In the hinge holding unit 56, for example, the key groove 130 is formed in the insertion direction of the hinge module 58. The guide key 100 formed in a longitudinal direction of the hinge module 58 engages with the key groove 130. This inhibits the hinge module 58 held inside the hinge holding unit 56 from rotating. As illustrated in FIG. 16, the insertion hole of the hinge holding unit 56 includes a gate unit 132. The gate unit 132 is an example of a unit that limits the insertion direction of the hinge module 58 so that the standing wall unit 106 that contacts the locking pin 92 or the like is arranged toward the window unit 72.

As illustrated in FIGS. 17 and 18, the gate unit 132 is formed up to a side wall unit 134 of the window unit 72 that is opened in the hinge holding unit 56. When the standing wall unit 106 of the hinge module 58 is inserted toward the window unit 72, the insertion position of the hinge module 58 is determined if the standing wall unit 106 passes through the gate unit 132 and reaches a side wall unit 136.

If the hinge module 58 is inserted into the hinge holding unit 56 in a prescribed direction, as illustrated in FIG. 19, the standing wall unit 106 of the hinge module 58 and the hole 108 of the flat surface unit 104, for example, are arranged in the window unit 72. As illustrated in FIG. 20, the standing wall unit 106 of the hinge module 58 contacts the side wall unit 136 and is arranged toward the window unit 72.

If the hinge module 58 is inserted into the hinge holding unit 56 in a wrong direction, the hinge module 58 may not be fully inserted because, for example, the standing wall unit 106 contacts an external unit of the hinge holding unit 56 or contacts the side wall unit 136 or the guide key 100 included in the cylinder-shaped form contacts the side wall unit 136. Accordingly, the guide key 100, the key grove 130 of the hinge holding unit 56, or the like may arrange the locking member 102 included in the hinge module 58 may be arranged toward the unhinging inhibiting mechanism unit arranged toward the window unit 72.

Figure 21:
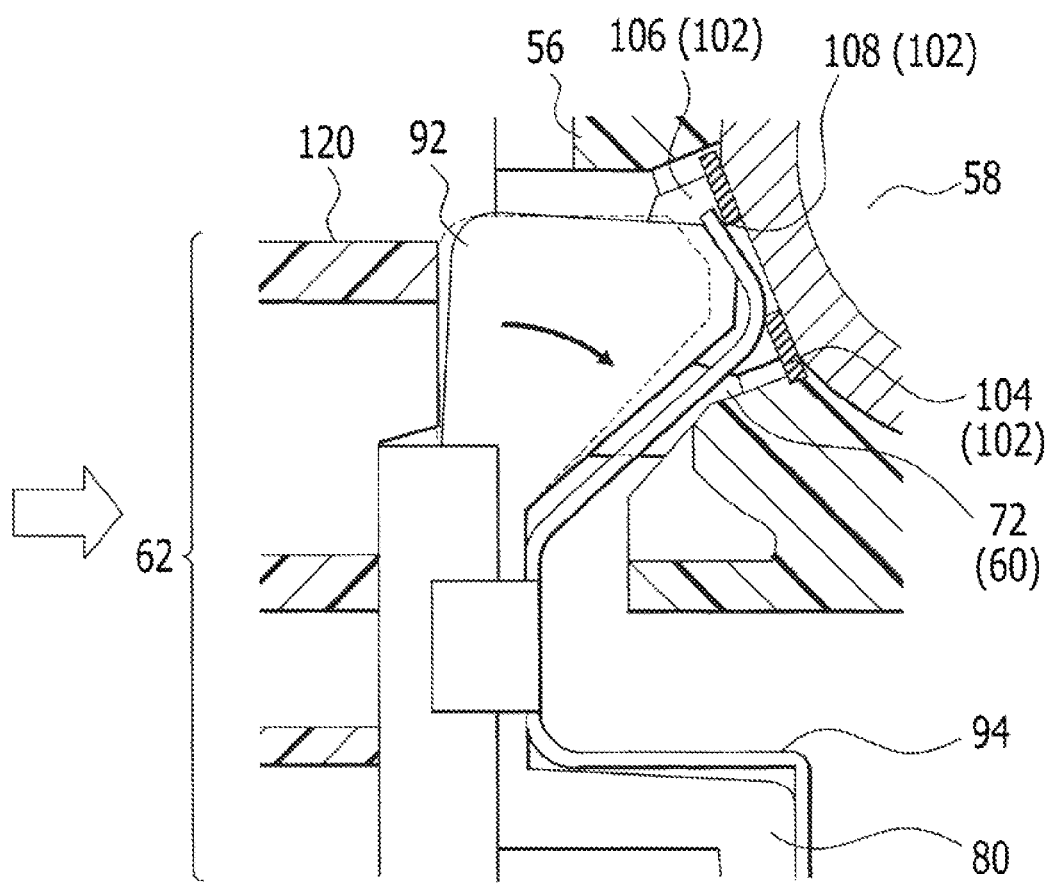
FIG. 21 is a diagram illustrating a contact state of a locking pin, a spring, and a hinge module.
Figure 22:
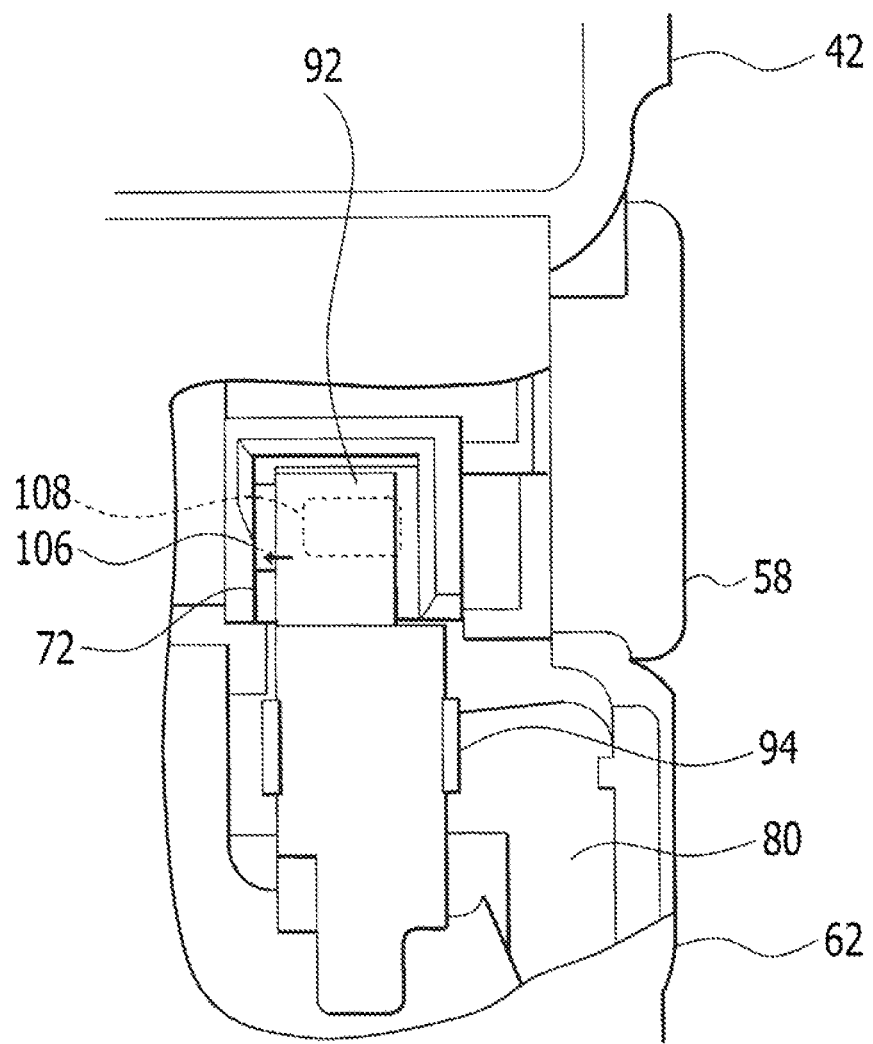
FIG. 22 is a diagram illustrating a contact state of a locking pin, a spring, and a standing wall unit.

With reference to FIGS. 21 and 22, the state of the unhinging inhibiting will be described. FIG. 21 is a diagram illustrating a contact state of a locking pin, a spring, and a hinge module. FIG. 22 is a diagram illustrating a contact state of a locking pin, a spring, and a standing wall unit. The configurations illustrated in FIGS. 21 and 22 are examples.

The hinge module 58 is inserted into the hinge holding unit 56, and the substrate assembly 64 is arranged corresponding to the fixed front case 60 so that the locking pin 92 passes through the window unit 72. For example, if the fixing screw 76 illustrated in FIG. 5 as a fastening unit is used to fasten the fixed front case 60 and the fixed rear case 62, the locking pin 92 is pressed by the pressing unit 120 to be fitted into the hinge module 58 as illustrated in FIG. 21. The locking pin 92 locks the flat surface unit 104 of the hinge module 58 through the spring 94. Since the locking pin 92 and the spring 94 are pressed toward the side of the hinge module 58, the hinge module 58 may be inhibited from unhinging the hinge holding unit 56.

As illustrated in FIG. 22, if the standing wall unit 106 contacts the side of the locking pin 92 and the spring 94 pressed toward the hinge module 58, the hinge module 58 may be inhibited from moving to the insertion hole of the hinge holding unit 56.

In this case, the mobile phone 40 includes the spring 94 as a reinforced member of the locking pin 92.

However, the configuration without the reinforced member is applicable. The configuration is not limited to a case where the locking pin 92 is locked on the hinge module 58 by contacting and holding the spring 94. For example, the unhinging inhibiting is performed if the press-fitted locking pin 92 may have the spring 94 and the spring 94 contacts the hinge module 58.

The dummy hinge 66 achieves an effect of the unhinging inhibiting by the cable 110 or the like that passes through the hole thereof. The above-described unhinging inhibiting mechanism may also be included in the dummy hinge 66.

If the locking pin 92 included in the substrate holding member 80 is locked on the hinge module 58 from the window unit 72 of the fixed front case 60, the hinge module 58 may be inhibited from unhinging. The substrate holding member 80 is fixed by joining the fixed front case 60 to the fixed rear case 62, and the locking pin 92 of the substrate holding member 80 is pressed toward the hinge module 58. As a result, the hinge module 58 may be locked tightly. If the assembly of the fixed front case 60 and the fixed rear case 62 is released, the locking of the locking pin 92 on the hinge module 58 is released. This improves the assembling property, and the locking pin 92 may be reused in reassembling. When the holding strength of the hinge module 58 is improved, the assembling property of the mobile phone 40 is also improved. The assembling process may be reduced, the assembling and releasing may become easier and quicker. This makes maintenance such as fixing and adjusting easier and quicker. The provision of the spring 94 may inhibit the locking pin 92 from being damaged, and the contacting property is improved. This may maintain an unhinging inhibiting state of the hinge module.

[Third Embodiment]

A third embodiment illustrates an example of a manufacturing method of an electronic apparatus that includes an unhinging inhibiting mechanism unit.

Figure 23:
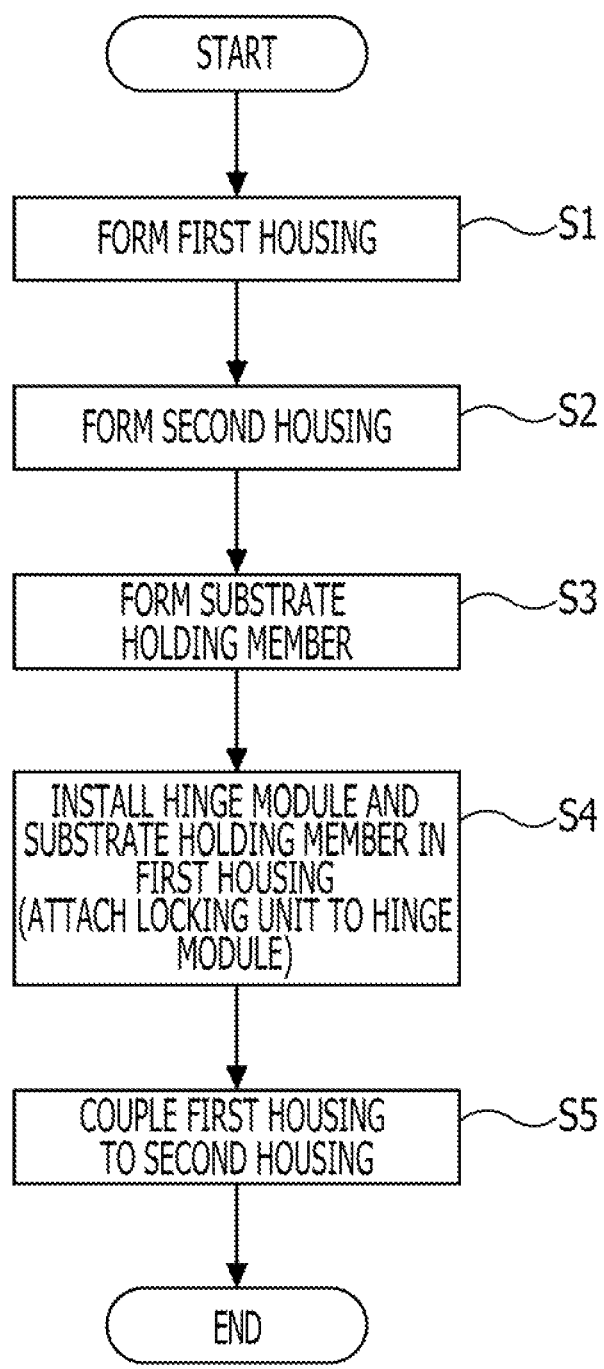
FIG. 23 is a flowchart illustrating an example of a manufacturing process of an electronic apparatus according to a third embodiment.

With reference to FIG. 23, the third embodiment will be described. FIG. 23 is a flowchart illustrating an example of a manufacturing process of an electronic apparatus. The processing content, the processing procedure, and the like illustrated in FIG. 23 are examples.

The manufacturing method is an example of a manufacturing method of the electronic apparatus according to the present embodiment. The manufacturing method includes a forming process (Operation S1) of the first housing, a forming process (Operation S2) of the second housing, and a forming process (Operation S3) of the substrate holding member. The manufacturing method further includes an installing process (Operation S4) of a hinge module and a substrate holding member, and a joining process of the first housing and the second housing (Operation S5).

In the forming process (Operation S1) of the first housing, the front side case unit 10 is formed as the first housing. On the front side case unit 10, a hinge holding unit 20 that holds the hinge module 8 is formed, and the window unit 22 that is opened toward the hinge holding unit 20 is formed. The first housing may be made of a resin material, for example.

In a forming process (Operation S2) of the second housing, the back side case unit 12 is formed as the second housing. A pressing unit 24 is formed in the back side case unit 12. The second housing and the pressing unit 24 may be combined by a resin material, for example.

In the forming process (Operation S3) of the substrate holding member, for example, the substrate holding member 14 with a plurality of substrates 26 and 28 held on the both sides thereof is formed, and a locking unit 16 that locks the above-described hinge module 8. The substrate holding member 14 and the locking unit 16 may be combined and made of a resin material, for example.

The electronic apparatus 2 and the unhinging inhibiting mechanism unit of the hinge module 8 are assembled. In the installing process (Operation S4) of the hinge module and the substrate holding member in the first housing, the substrate holding member 14 is installed so that the locking unit 16 is arranged to the window unit 22 after the hinge module 8 is inserted into the hinge holding unit 20 formed on the front side case unit 10.

In the joining process (Operation S5) of the first housing and the second housing, the back side case unit 12 is installed with respect to the front side case unit 10 so that the first housing is joined to the second housing. For example, fastening is performed by a fastening unit such was a screw. The locking unit 16, which is arranged in the window unit 22 of the front side case unit 10, is pressed by the pressing unit 24 of the back side case unit 12, and passes through the window unit 22 to contacts the hinge module 8. The electronic apparatus 2 is assembled in the above-described process. The hinge module 8 may be inhibited from unhinging by contacting the pressed locking unit 16.

To release the assembly of the electronic apparatus 2, the above-described process may be performed in reverse, for example.

According to the above-described configuration, the hinge module 8 may be held by joining the front side case unit 10 to the back side case unit 12. This may decrease the assembling process. As a result, the assembling and reassembling become easier and quicker, and the maintenance such as repairing and adjusting becomes simpler and quicker as well. If the assembly of the front side case unit 10 and the back side case unit 12 is released, the locking of the locking unit 16 on the hinge module 8 is released. This may improve the assembling property. Furthermore, the locking unit may be reused in reassembling.

[Fourth Embodiment]

A fourth embodiment illustrates a configuration example of a mobile phone that uses a hinge module as an antenna function unit by being coupled to an unhinging inhibiting mechanism unit.

Figure 24:
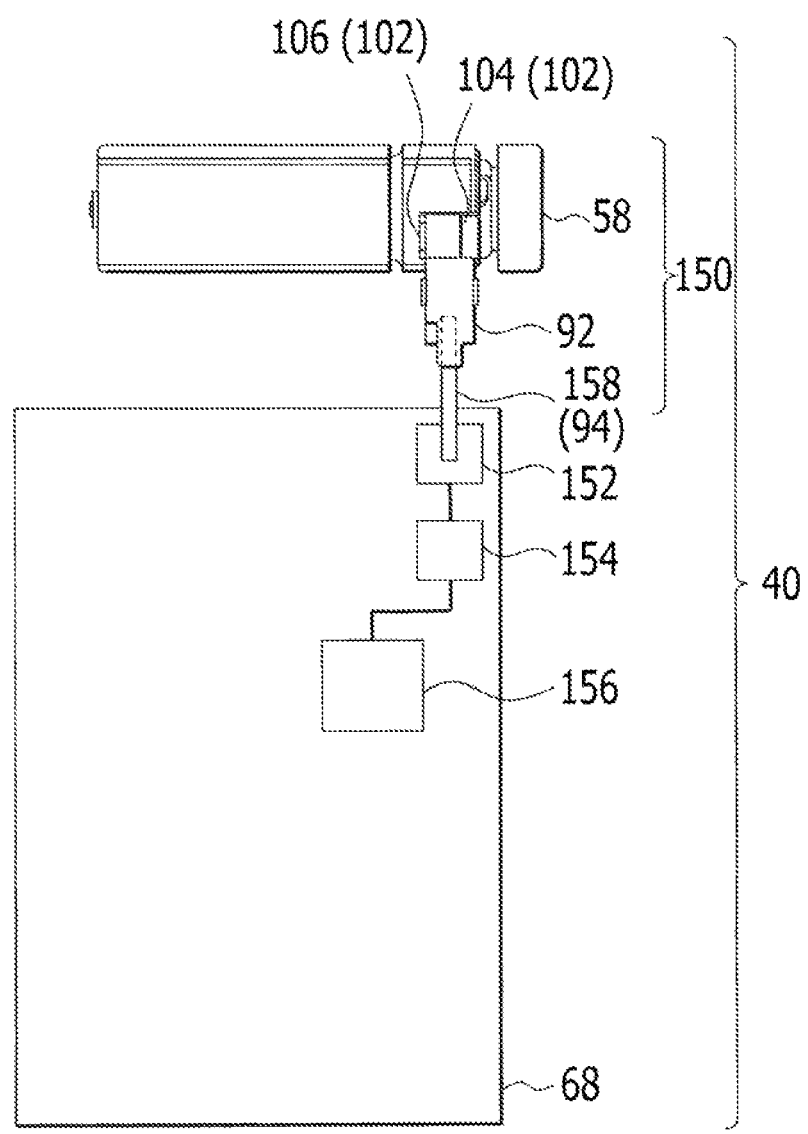
FIG. 24 is a diagram illustrating a functional configuration of a mobile phone according to the fourth embodiment.
Figure 25:
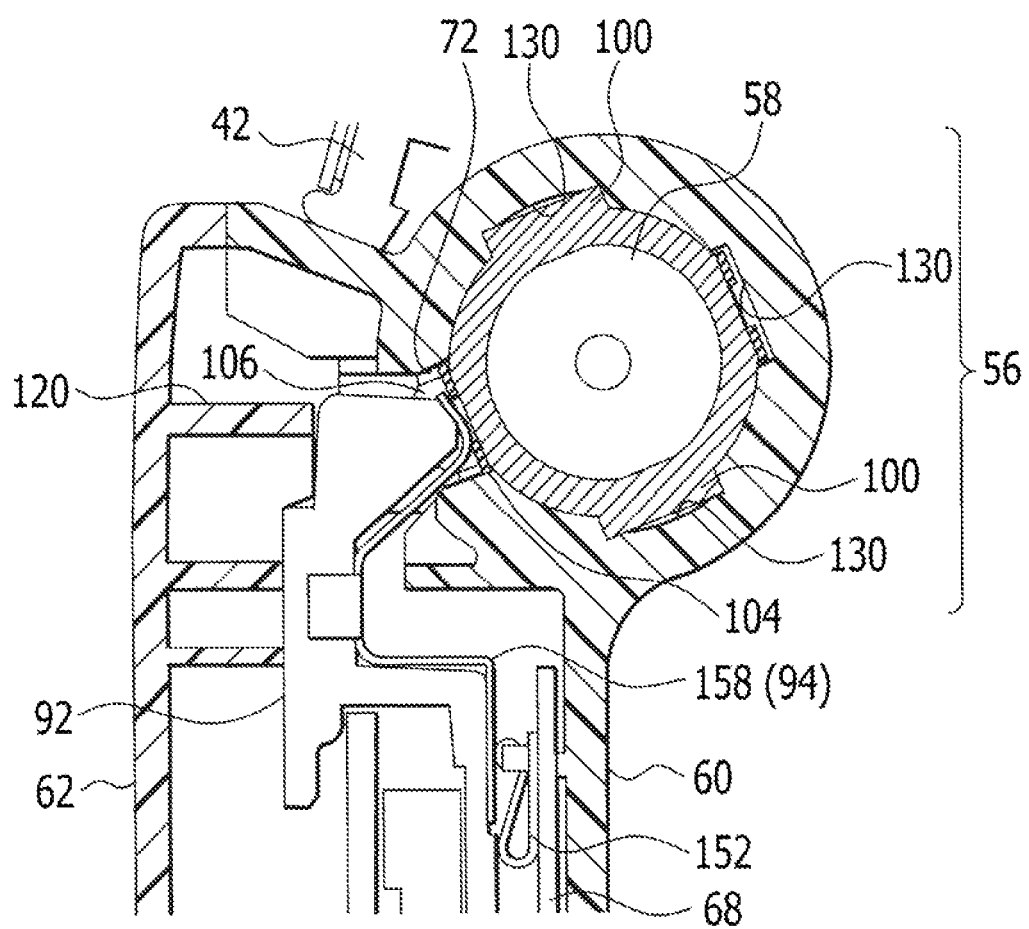
FIG. 25 is a diagram illustrating an example of a coupled-state of an unhinging inhibiting mechanism unit with a substrate.

With reference to FIGS. 24 and 25, the fourth embodiment will be described. FIG. 24 is a diagram illustrating a functional configuration of a mobile phone according to the fourth embodiment. FIG. 25 is a diagram illustrating an example of a coupled-state of an unhinging inhibiting mechanism unit with a substrate. The configurations illustrated in FIGS. 24 and 25 are examples.

The mobile phone 40 is an example of the electronic apparatus according to the fourth embodiment. The mobile phone 40 includes an unhinging inhibiting mechanism unit and uses the hinge module 58 with a certain length as an antenna. As illustrated in FIG. 24, in addition to the locking pin 92 as an unhinging inhibiting mechanism unit, the mobile phone 40 includes an antenna unit 150, an antenna contact land 152, an antenna matching circuit 154, a radio unit 156, and the like.

The antenna unit 150 is an example of a unit that receives a radio wave of a radio communication, television, and the like and includes the hinge module 58. Since the hinge module 58 is used as an antenna, the antenna unit 150 includes a conductor member 158, which is made of metal materials and is to be electrically coupled to the substrate 68. The conductor member 158 may be installed in the locking pin 92 as the unhinging inhibiting unit of the hinge module 58, for example. When the fixed front case 60 and the fixed rear case 62 of the mobile phone 40 are joined, one end side of the conductor member 158 and the locking pin 92 contact the hinge module 58. The other side end of the conductor member 158 is coupled to the antenna contact land 152 included in the substrate 68, so that the hinge module 58 is electrically coupled to the substrate 68.

The antenna contact land 152, which is an example of a power feed point of the substrate 68 side, couples the antenna unit 150 to the radio unit 156 by the conductor member 158. As illustrated in FIG. 25, for example, the antenna contact land 152 is installed on the substrate 68 and includes a metallic member with a certain height to contact the conductor member 158 installed in the locking pin 92. The antenna matching circuit 154 is a circuit function unit that matches impedance or the like between the antenna unit 150 and the radio unit 156.

The radio unit 156, which is an example of a functional unit that receives a radio wave from the antenna unit 150, includes, for example, a broadcast reception function unit that receives a radio wave from television or radio. The radio unit 156 may transmit and receive a radio signal to be used for data communication such as telephone communication, packet communication, and the like.

The conductor member 158 transmits the radio wave received by the antenna unit 150 to the substrate 68. As illustrated in FIG. 25, for example, the conductor member 158 includes a plate spring part that is similar to the spring 94, which is metallic, as a reinforced member of the above-described locking pin 92. The conductor member 158 is arranged to pass through the window unit 72 of the fixed front case 60 and positioned between the locking pin 92 and the hinge module 58. The conductor member 158 may be used as a reinforced member corresponding to the above-described locking pin 92.

The configuration illustrated in the above-described embodiments may be used for the unhinging inhibiting mechanism unit.

According to the configuration of the embodiment, the hinge module 58 is used as an antenna and may perform reception of television, radio, and the like in the mobile phone 40. When the conductor member 158 is used as a reinforced member, the locking pin 92 is inhibited from being damaged, and the size of the mobile phone 40 may be reduced. Since the conductor member 158 includes a spring member, the contacting property with the hinge module 58 may be improved.

According to the above-described first, second, third, and fourth embodiments, advantages will be described below.

(1) The unhinging inhibiting mechanism unit of the hinge module 58 includes an unhinging inhibiting mechanism unit in a part that holds the substrate assembly 64 in which a substrate is unitized in the mobile phone 40 as the electronic apparatus 2.

(2) The unhinging inhibiting mechanism unit of the hinge module 58 has a configuration in which the hinge module 58 is pressed from the outside thereof so that the locking pin 92 contacts the side of the hinge module 58. The fixed rear case 62, which includes the pressing unit 120, has a configuration in which the fixed rear case 62 and the fixed front case 60 are fastened by the fixing screw 76, and the locking pin 92 is pressed toward the hinge module 58 through the pressing unit 120. This may inhibit the hinge module 58 from unhinging.

(3) The spring 94, as a reinforced member, inhibits the locking ping 92 that contacts the hinge module 58 from being damaged or bent and is installed in the locking pin 92.

(4) The mobile phone 40 uses the hinge module 58 made of metallic materials as an antenna. The mobile phone 40 includes the conductor member 158 that is used to mechanically and electrically couple the hinge module 58 to the power feed point of the substrate 68. If the conductor member 158 includes a metallic plate spring part, the contacting property may be improved. The conductor member 158 is used as a reinforced member of the above-described locking pin 92.

(5) According to the above-described configuration, since the locking pin 92 as an unhinging inhibiting unit includes the substrate holding member 80 included in the substrate assembly 64, another part for hinge unhinging inhibiting is not typically installed. Thus, the number of the parts is not increased.

(6) Since the substrate holding member 80 included in the substrate assembly 64 includes the locking pin 92 as the unhinging inhibiting unit, the unhinging inhibiting part is not press-fitted. This may improve the assembling property or the reassembling property of the electronic apparatus.

(7) For example, if the reinforced member such as the spring 94, which is metallic, is included, the locking pin 92 may become smaller. This may reduce the size the mobile phone 40.

(8) The substrate holding member 80, which includes the locking pin 92, inhibits the hinge module 58 from unhinging by assembling the electronic apparatus 2.

The unhinging inhibiting part as described above is not press-fitted. Accordingly, a specific fixture used to perform press-fitting processing is not typically used, and the unhinging inhibiting part may be easily removed. This may improve the assembling or reassembling property of the electronic apparatus. Since the press-fitting processing is not performed, the unhinging inhibiting part may be reused in reassembling of the electronic apparatus.

COMPARISON EXAMPLE

Figure 26:
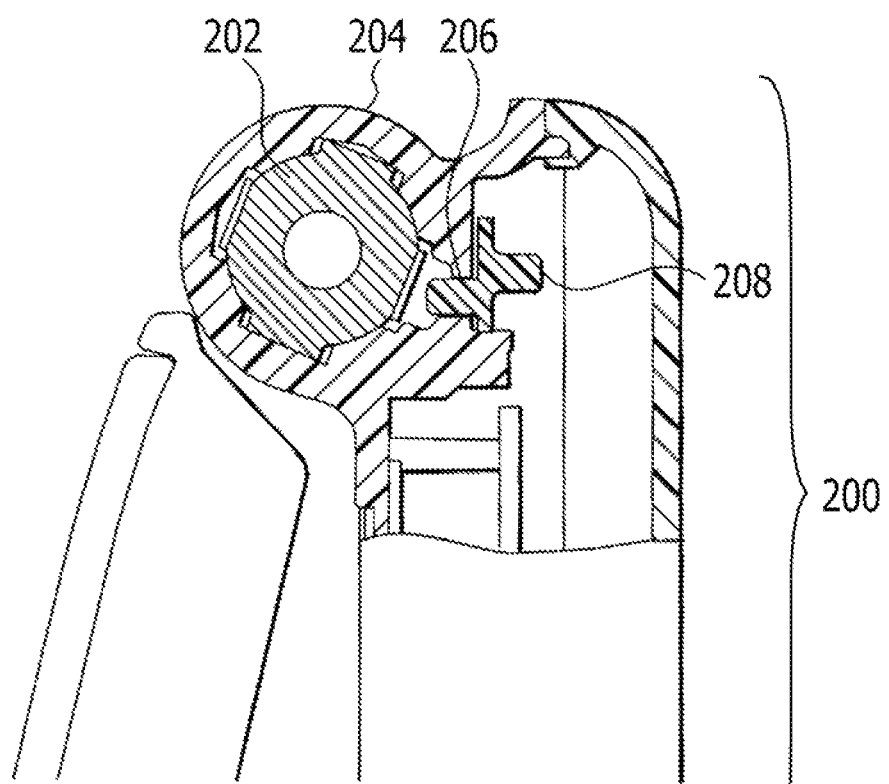
FIG. 26 is a diagram illustrating a comparison example of an unhinging inhibiting unit.
Figure 27:
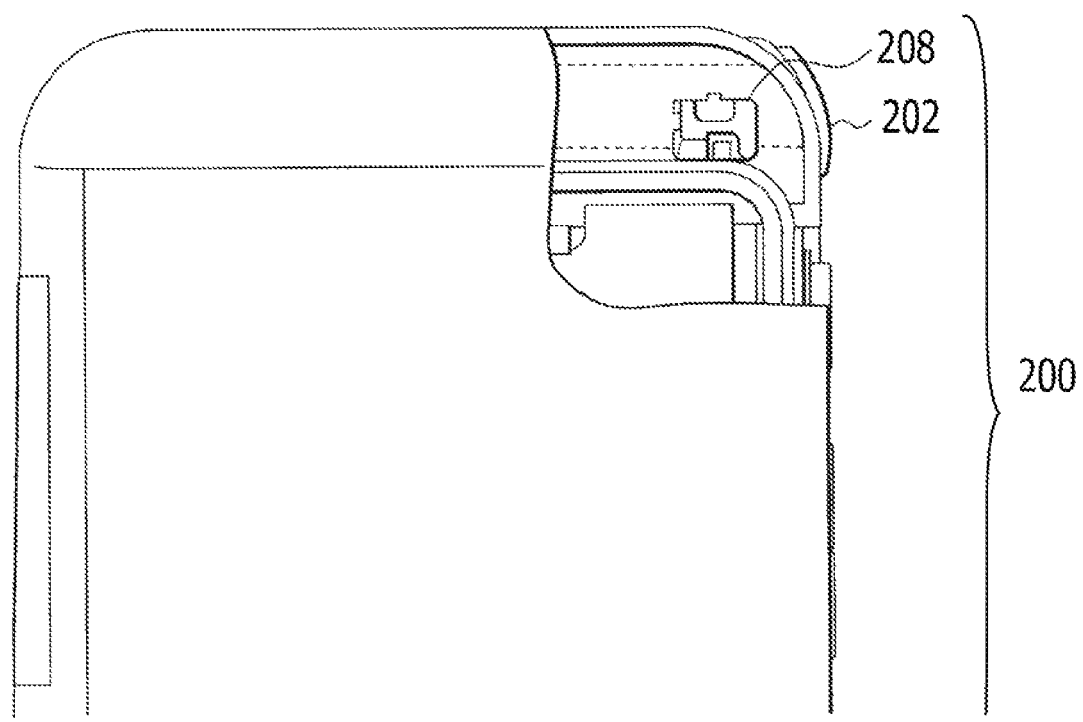
FIG. 27 is a diagram illustrating another comparison example of the unhinging inhibiting unit.

Comparison examples will be described with reference to FIGS. 26 and 27. FIGS. 26 and 27 are diagrams illustrating comparison examples of the unhinging inhibiting unit.

As illustrated in FIG. 26, an electric apparatus 200 includes an unhinging inhibiting part 208 in a hole 206 arranged in a hinge holding unit 204 corresponding to an inserted hinge module 202. To insert and attach the hinge module 202 from the outside of the electronic apparatus 200, the unhinging inhibiting is performed by the unhinging inhibiting part 208 of the hinge module 202 that is made of another part and is then press-fitted. In this case, for example, a specific fixture is desired to attach the protruding inhibiting part 208, and the unhinging inhibiting part 208 once installed may not be reused. As illustrated in FIG. 27, to improve the effect of the unhinging inhibiting, the unhinging inhibiting part 208 is enlarged, so that an installation space is typically ensured. This makes it difficult to reduce the size the electronic apparatus.

On the other hand, the above-described problems are solved by the electronic apparatus and manufacturing method disclosed in the present embodiment.

[Other Embodiments]

(1) According to the above-described embodiments, the spring 94 is described as the conductor member 158 that reinforces the locking pin 92 or electrically couples the hinge module 58 to the substrate 68. However, the conductor member 158 is not limited to the spring 94. For example, the locking pin 92 may be subjected to plating processing or may be made of conductive resin materials. In the configuration in which the locking pin 92 contacts the antenna contact land 152 of the substrate 68, the strength of the locking pin 92 is improved, and the hinge module 58 may be electrically coupled to the substrate 68.

Figure 28:
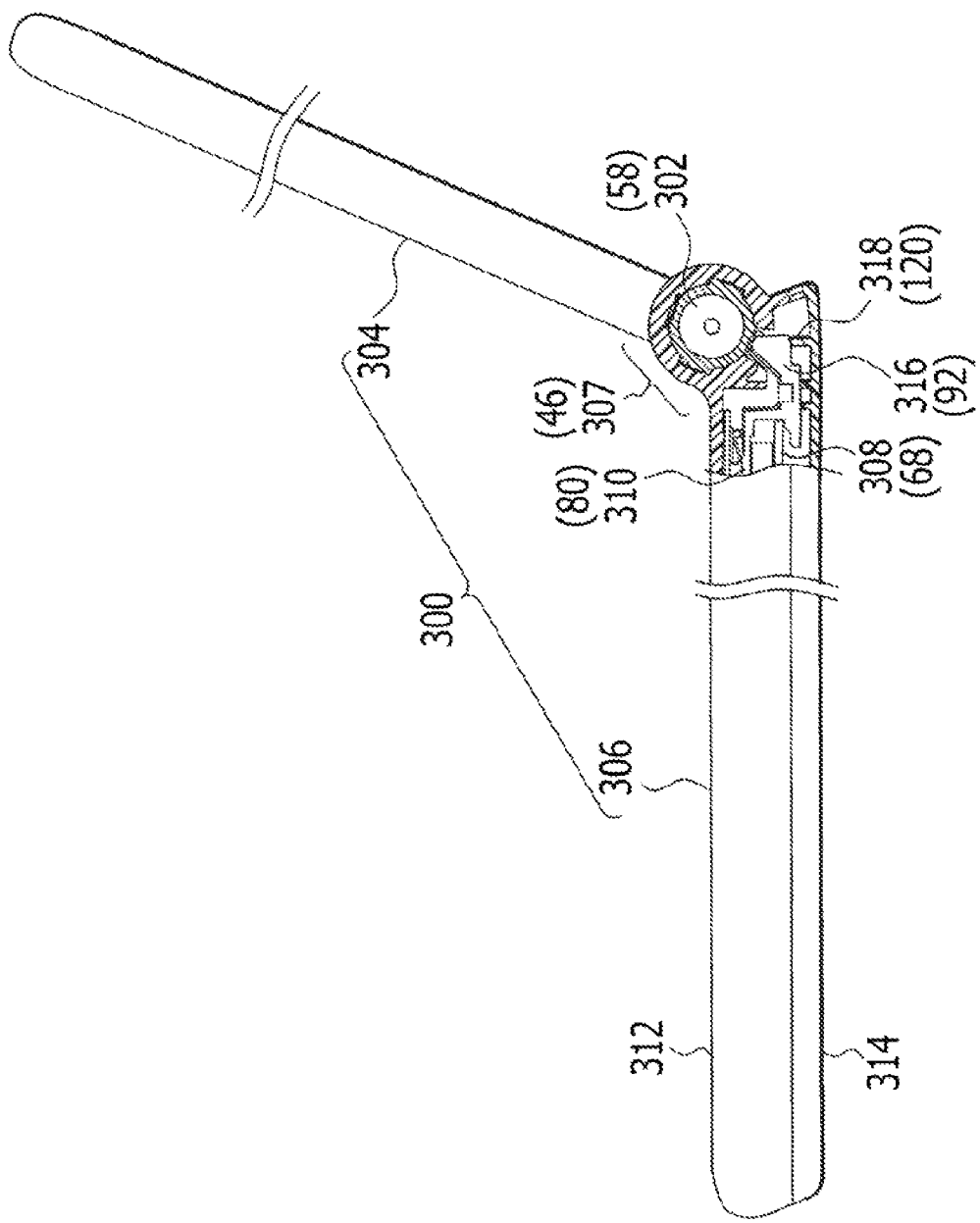
FIG. 28 is a diagram illustrating a personal computer according to another embodiment.

(2) In the above-described embodiment, the mobile phone 40 is described as an example of the electronic apparatus. However, the electronic apparatus is not limited to the mobile phone 40. As illustrated in FIG. 28, for example, a personal computer (hereinafter referred to as PC) 300 that includes a hinge module 302 is applicable.

The PC 300 includes a display side housing 304 and a keyboard side housing 306 and may be opened and closed by the hinge module 302 included in a hinge unit 307. For example, the keyboard side housing 306 holds and fixes a substrate holding member 310, which holds a substrate 308, in a front case 312 and a rear case 314. The substrate holding member 310 includes a locking unit 316 that locks the inserted hinge module 302. The rear case 314 includes a pressing unit 318 that presses the locking unit 316. For example, if the front case 312 and the rear case 314 are joined and fixed with a screw or the like, the locking unit 316 is pressed to contact the hinge module 302 by the pressing unit 318. This may inhibit the hinge module 302 from unhinging.

For example, a video game machine with a hinge module, a Personal Digital Assistant (PDA), or the like may be used as the electronic apparatus 2.

(3) The above-described embodiment has illustrated a case where the unhinging inhibiting mechanism unit is included in the keyboard side housing 44. However, the unhinging inhibiting mechanism unit may be included inside the display side housing 42, for example. In this case, for example, the display side housing 42 may include a holding member that holds the display unit 50, a substrate, and the like, and may include a locking unit as an unhinging inhibiting mechanism unit in the holding member.

(4) According to the above-described embodiment, the conductor member 158 that electrically couples the hinge module 58 to the substrate 68 is used as a reinforced member. The conductor member 158 and the spring 94 as a reinforced member may be used as other members.

(5) In the above-described embodiment, the front side case unit 10 is joined to the back side case unit 12 as the first housing and the second housing, respectively, and a fixing screw is illustrated as a fastening unit. However, the fastening unit is not limited to the fixing screw. The fastening unit presses the locking unit 16 by using the pressing unit 24 when the front side case unit 10 is joined to the back side case unit 12. For example, a claw as a locking unit may be included in the front side case unit 10 or the back side case unit 12. The front side case unit 10 may be joined to the back side case unit 12 by filling adhesive between thereof and applying a prescribed force.

All examples and conditional language recited herein are intended for pedagogical purposes to aid the reader in understanding the principles of the invention and the concepts contributed by the inventor to furthering the art, and are to be construed as being without limitation to such specifically recited examples and conditions. Although the embodiment(s) of the present invention(s) has(have) been described in detail, it should be understood that the various changes, substitutions, and alterations could be made hereto without departing from the spirit and scope of the invention.

What is claimed is:

1. An electronic apparatus, comprising:
a first case housing a display unit; and
a second case housing a cylinder-shaped hinge module inserted from a side of the electronic apparatus so as to rotatably connect the first case to the second case, the second case including
a first housing in which a window unit is formed in a holding unit which holds the cylinder-shaped hinge module;
a second housing which is joined to the first housing; and
a substrate holding member which is arranged between the first housing and the second housing; and
wherein the substrate holding member passes through the window unit of the first housing and includes a locking unit which locks the cylinder-shaped hinge module by being pressed by the second housing.

2. The electronic apparatus according to claim 1, further comprises a pressing unit included in the second housing, and which presses the locking unit toward the cylinder-shaped hinge module by assembly of the first housing and the second housing.

3. The electronic apparatus according to claim 1, wherein the locking unit locks the cylinder-shaped hinge module by being joined to a standing wall unit provided in the cylinder-shaped hinge module.

4. The electronic apparatus according to claim 1, wherein the substrate holding member further comprises a reinforced member which covers a part or an entirety of a contact surface on which the locking unit contacts the cylinder-shaped hinge module, and
wherein the locking unit locks the cylinder-shaped hinge module through the reinforced member.

5. The electronic apparatus according to claim 1, further comprising:
a conductor member used to electrically couple the cylinder-shaped hinge module to a substrate held by the substrate holding member; and
a radio unit, which is installed in the substrate, that transmits and receives a radio wave through the conductor member by using the cylinder-shaped hinge module.

6. The electronic apparatus according to claim 5, wherein the conductor member reinforces the locking unit which contacts the cylinder-shaped hinge module.

7. The electronic apparatus according to claim 1, wherein the holding unit further comprises a key groove that regulates an insertion position and an insertion direction of the cylinder-shaped hinge module.

8. A manufacturing method of an electronic apparatus, the method comprising:
forming a first case housing a display unit;
forming a first housing in which a window unit is formed in a holding unit which holds a cylinder-shaped hinge module;
forming a second housing which is to be joined to the first housing to form a second case, wherein the cylinder-shaped hinge module is inserted from a side of the second case so as to rotatably connect the first case to the second case; and
forming a substrate holding member, which is installed between the first housing and the second housing, that includes a locking unit, which locks the cylinder-shaped hinge module by passing through the window unit of the first housing and by being pressed by the second housing.

9. The manufacturing method of the electronic apparatus according to claim 8, further comprising forming a pressing unit which presses the locking unit toward the cylinder-shaped hinge module by assembly of the first housing and the second housing.

10. The manufacturing method of the electronic apparatus according to claim 8, further comprising:

forming a reinforced member, which covers a part or an entirety of a contact surface on which the locking unit contacts the cylinder-shaped hinge module, in the substrate holding member; and locking the cylinder-shaped hinge module with the locking unit through the reinforced member.

11. The manufacturing method of the electronic apparatus according to claim 8, further comprising:

electrically coupling the cylinder-shaped hinge module to a substrate held in the substrate holding member by a conductor member; and installing, in the substrate, a radio unit which receives and transmits a radio wave by using the cylinder-shaped hinge module.

\* \* \* \* \*